United States Patent
Hohman

(10) Patent No.: US 11,127,244 B2
(45) Date of Patent: Sep. 21, 2021

(54) UNIVERSAL ADJUSTABLE PRINTER BEZEL

(71) Applicant: AGS LLC, Las Vegas, NV (US)

(72) Inventor: Kevin Lee Hohman, North Las Vegas, NV (US)

(73) Assignee: AGS LLC, Las Vegas, NV (US)

( * ) Notice: Subject to any disclaimer, the term of this patent is extended or adjusted under 35 U.S.C. 154(b) by 410 days.

(21) Appl. No.: 15/990,227

(22) Filed: May 25, 2018

(65) Prior Publication Data

US 2019/0362592 A1    Nov. 28, 2019

(51) Int. Cl.
| | | |
|---|---|---|
| G07D 11/14 | (2019.01) | |
| G07F 17/32 | (2006.01) | |
| H01R 12/70 | (2011.01) | |
| H05K 5/00 | (2006.01) | |
| H01R 12/75 | (2011.01) | |
| H01R 12/53 | (2011.01) | |

(52) U.S. Cl.
CPC ......... G07F 17/3216 (2013.01); G07D 11/14 (2019.01); G07F 17/3251 (2013.01); H01R 12/7076 (2013.01); H05K 5/0069 (2013.01); H01R 12/53 (2013.01); H01R 12/75 (2013.01)

(58) Field of Classification Search
CPC . G07D 11/14; G07F 17/3216; G07F 17/3251; G07F 17/3218; G07F 17/3211; H01R 12/7076; H01R 12/75; H01R 12/53; H05K 5/0069
USPC ................ 194/206, 207, 344, 351; 235/379
See application file for complete search history.

(56) References Cited

U.S. PATENT DOCUMENTS

| | | | |
|---|---|---|---|
| 6,575,090 B1 | 6/2003 | Vienneau et al. | |
| D490,473 S | 5/2004 | Knobel | |
| 7,063,254 B2 | 6/2006 | Tula et al. | |
| 9,087,414 B2 | 7/2015 | Vienneau et al. | |
| 2003/0015397 A1* | 1/2003 | Coulter | G07D 9/00 194/353 |
| 2004/0053698 A1* | 3/2004 | Tastad | G07F 17/32 463/46 |
| 2004/0184861 A1 | 9/2004 | Knobel | |
| 2008/0113709 A1 | 5/2008 | Beadell et al. | |
| 2010/0224462 A1 | 9/2010 | Vienneau et al. | |
| 2011/0320043 A1* | 12/2011 | Mikuszewski | G06F 1/20 700/275 |
| 2014/0090950 A1* | 4/2014 | Johnson | G07F 19/20 194/344 |
| 2016/0012670 A1* | 1/2016 | Peltz | G07F 17/3251 463/25 |

FOREIGN PATENT DOCUMENTS

WO    2008060953 A1    5/2008

OTHER PUBLICATIONS

Epic 950 by Transact, www.transact-tech.com, TACT001000_RevC.

(Continued)

*Primary Examiner* — Jeffrey A Shapiro
(74) *Attorney, Agent, or Firm* — Wolf IP Law PLLC; Dean E. Wolf, Esq.

(57) ABSTRACT

Various aspects disclosed herein are directed to different systems and methods for providing a universal, adjustable printer bezel assembly which is compatible for use with a plurality of different types of ticket printer devices from different ticket printer manufacturers.

15 Claims, 12 Drawing Sheets

(56) References Cited

OTHER PUBLICATIONS

Epic Edge, Tito printer, Transact, www.transact-tech.com, TACT001026_RevA.
FutureLogic printing & couponing solutions—Operators and Technicians Manual GEN3 Evolution Printer. PSA-66-ST3 (RS232/USB). Copyright 2011-2012 FutureLogic, Inc. www.futurelogic-inc.com. Nov. 15, 2012 MNL-000067 Rev.X02.
FutureLogic, Inc.—Bezel Selection Guide, Aug. 1, 2008. Copyright 2008.
Prior Art 1—Piece Bezel plus Universal connector Port EASM pdf. Transact Technologies, ww.transact-tech.com,—Epic 950, Copyright 2011, MB-005 A, TA_950SS_ENG_TA Nov. 5, 2010.

\* cited by examiner

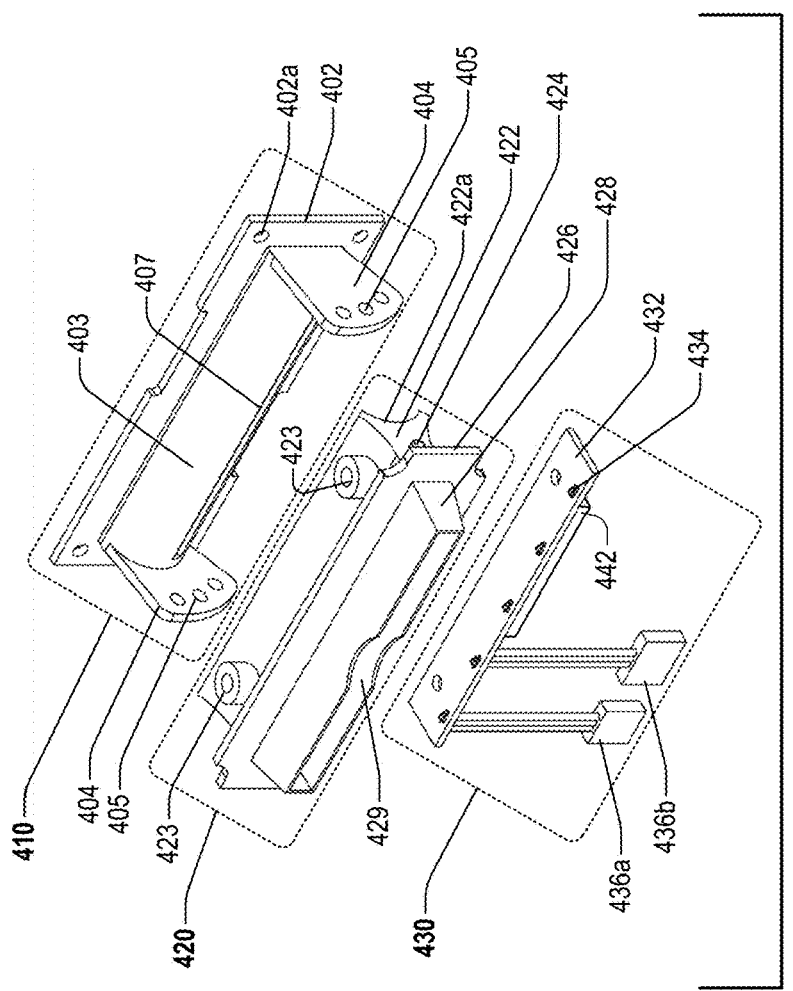
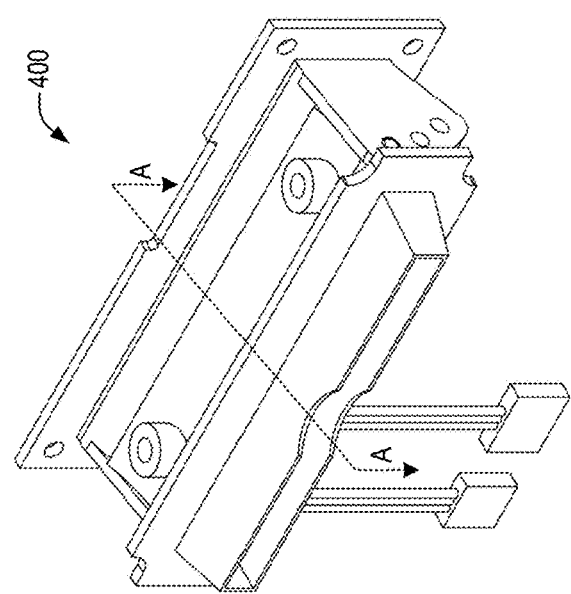

UNIVERSAL ADJUSTABLE PRINTER BEZEL

TECHNICAL FIELD

The present invention relates generally to peripheral ticket printing devices, and more particularly to peripheral ticket printing devices and hardware interfaces suitable for deployment at casino gaming machines and other electronic devices which are configured or designed to dispense physical tickets.

BACKGROUND

The gaming machine manufacturing industry provides a variety of gaming machines and gaming tables for the amusement of patrons at gaming establishments such as casinos. Within the past few decades, the gaming industry introduced the ticket-in ticket out ("TITO") concept, replacing coin hoppers with printed vouchers enabling the transfer of credit from one gaming machine to another by inserting and validating these vouchers via the bill validators.

Today, the vast majority of electronic gaming machines deployed at casinos include high-speed ticket printers for printing TITO vouchers when players cash out their winnings at such gaming machines. Typically, these ticket printers are securely installed as peripheral devices within the housings of the gaming machine cabinets.

In many instances, gaming machine manufacturers obtain their ticket printers and related components from trusted ticket printer manufactures such as, for example, FutureLogic, Inc., Transact Technologies, Inc., etc. Additionally, it is quite common for gaming machine manufacturers to design their gaming machines to support a variety of different ticket printers from different ticket printer manufactures. However, as is often the case, design specifications of the different ticket printers produced by the different ticket printer manufacturers may vary.

For example, vouchers (also referred to as "tickets" or "slips") are typically discharged from a ticket printer via a front bezel which is fixedly mounted onto the front face of the ticket printer device. Each ticket printer manufacturer typically manufactures its own ticket printer bezels, and the size, shape, and dimensions of the ticket printer bezels from one ticket printer manufacturer often differ from the size, shape, and dimensions of ticket printer bezels from other ticket printer manufacturers.

Additionally, many ticket printer bezels include electric wiring and LEDs for providing illumination of the bezel. However, it is noted that different ticket printer manufactures use different types of electrical harness connectors for providing power to LED PCB boards which are used to illuminate the bezels.

These differences in the design specifications of the different ticket printer bezels from different ticket printer manufacturers present various issues to gaming machine manufacturers with respect to the design of their gaming machine cabinets, and particularly with respect to the design of gaming machine cabinets which are intended to support a variety of different ticket printers/bezels from different ticket printer manufacturers.

For example, gaming machine cabinets are typically designed to include an aperture or opening on the front face of the gaming machine cabinet for receiving the ticket printer bezel, in order, for example, to allow the front portion of the ticket printer bezel (e.g., where the ticket comes out) to be accessible to the player. However, due to the differences in bezel design dimensions among the various ticket printer manufactures, various problems may be encountered when designing the opening of a gaming cabinet to support a variety of different ticket printers/bezels from different ticket printer manufacturers. Examples of such problems may relate to undesirable gaps between the ticket bezel and the gaming machine cabinet opening.

Other problems may relate to undesirable mismatches or discontinuities between the exterior surface of the gaming machine cabinet and visible portion(s) of the printer ticket bezel. This is particularly true in gaming cabinet designs where portions of the exterior surface of the gaming machine cabinet (e.g., surrounding the ticket printer bezel) are curved or sloped. To accommodate these sloped gaming cabinet designs, many ticket printer manufacturers offer different designs of sloped bezels which have been manufactured with different, static, preset angles. However, this has led to gaming machine manufacturers having to purchase more bezels in order to maintain an adequate supply of stock of the different types of sloped bezels manufactured by one or more of the ticket printer manufacturers.

BRIEF DESCRIPTION OF THE DRAWINGS

The included drawings are for illustrative purposes and serve only to provide examples of possible structures and arrangements for the disclosed inventive apparatuses, systems and methods for gaming machines having improved accommodations for limited mobility players. These drawings in no way limit any changes in form and detail that may be made to the disclosure by one skilled in the art without departing from the spirit and scope of the disclosure.

FIGS. 3-5, 6A, 6B, 7A, 7B, 8A, 8B, 9A, 9B, 10A, 10B, and 11-25 illustrate example embodiments of different types of universal adjustable printer bezels and components thereof.

DETAILED DESCRIPTION OF EXAMPLE EMBODIMENTS

Overview

Figure 1:
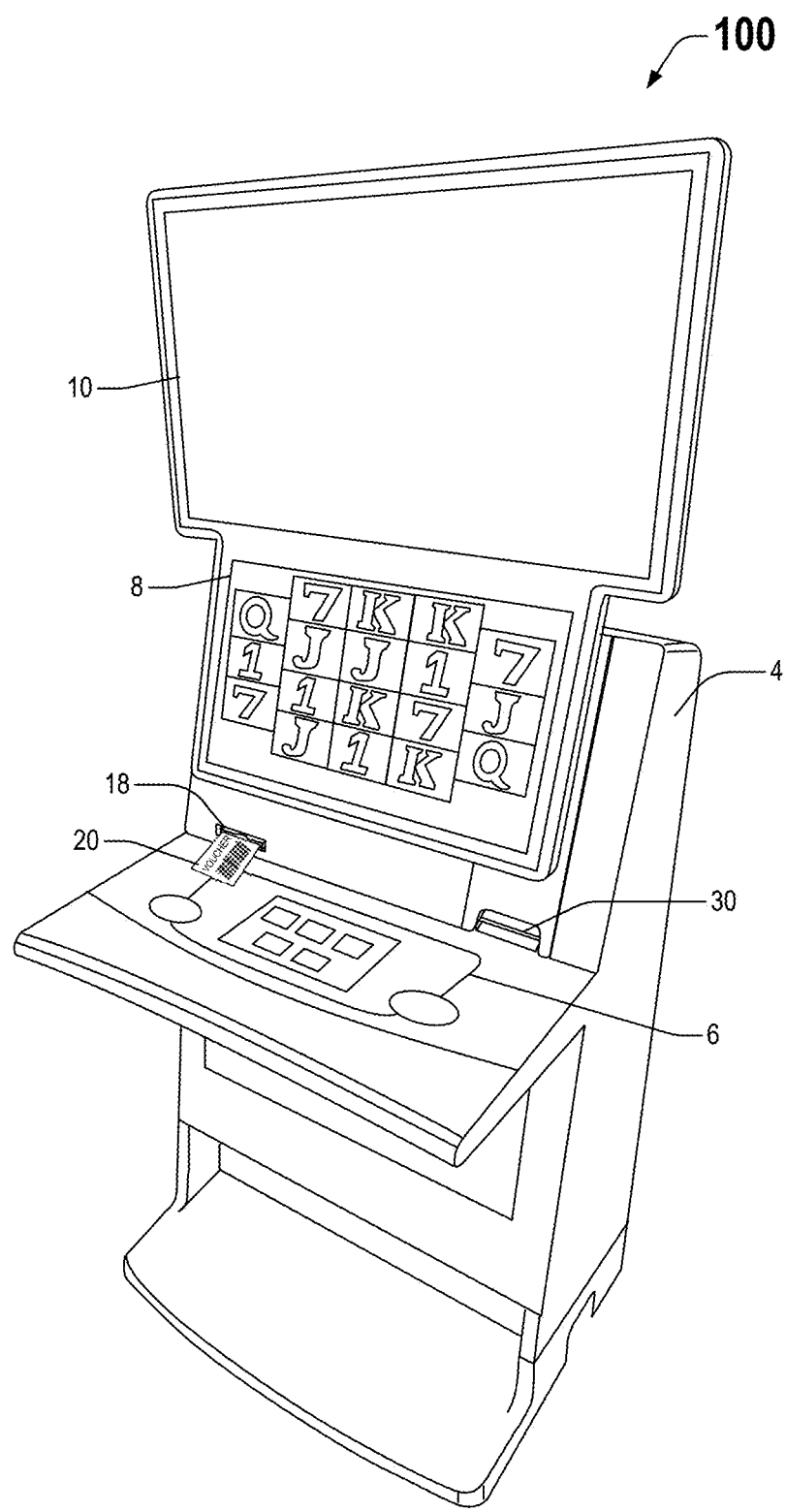
FIG. 1 illustrates in front perspective view a gaming machine according to one embodiment.

In light of the various problems and issues relating to currently existing gaming cabinet designs and ticket printer bezel designs, various aspects described herein are directed to different types of universal adjustable printer bezel designs, components, and features.

For example, various aspects disclosed herein are directed to different systems and methods for providing a universal, adjustable printer bezel assembly which is compatible for use with a plurality of different types of ticket printer devices from different ticket printer manufacturers.

According to different embodiments, various method(s) and system(s) are described for providing a bezel assembly for dispensing a flexible substrate (such as, for example, TITO ticket or voucher). In at least one embodiment, the bezel assembly comprises: a rear bezel body including a first slot disposed in the rear bezel body, the first slot having a first front opening for outputting the flexible substrate and having a first rear opening for receiving the flexible substrate, the first slot being configured or designed to facilitate transport of the flexible substrate through the first slot, the rear bezel body further including a first attachment interface; a front bezel body including a second slot disposed in the front bezel body, the second slot having a second front opening for outputting the flexible substrate and having a second rear opening for receiving the flexible substrate from the first front opening of the rear bezel body, the second slot being configured or designed to facilitate transport of the flexible substrate through the second slot, the front bezel body further including a second attachment interface; and wherein the front bezel body is removably connectable to the rear bezel body via the first and second attachment interfaces.

In some embodiments, the flexible substrate corresponds to a ticket-in/ticket-out ("TITO") type ticket or voucher.

In some embodiments, the front bezel body is removably attachable to the rear bezel body via the first and second attachment interfaces. In some embodiments, the front bezel body is removably attachable to the rear bezel body via engagement of the first attachment interface with the second attachment interface.

In some embodiments, the first and second attachment interfaces are configured or designed to provide a plurality of different engagement configurations for enabling the front bezel body and rear bezel body to be coupled together in accordance with a plurality of different positional configurations.

In some embodiments, the first and second attachment interfaces are configured or designed to enable the front bezel body and rear bezel body to be adjustably coupled together in a manner which enables the front bezel body and/or rear bezel body to be adjusted into a plurality of different positions.

In some embodiments, the first and second attachment interfaces are configured or designed to engage with each other in accordance with a plurality of different engagement configurations, including a first engagement configuration and a second engagement configuration; wherein, when the first and second attachment interfaces are mutually engaged in accordance with the first engagement configuration, the front bezel body and rear bezel body are coupled together in accordance with a first coupled configuration; and wherein, when the first and second attachment interfaces are mutually engaged in accordance with the second engagement configuration, the front bezel body and rear bezel body are coupled together in accordance with a second coupled configuration, different from the first coupled configuration.

In some embodiments, the front bezel body and rear bezel body are configured or designed in a manner such that, when the front bezel body is coupled to the rear bezel body, the first slot and second slot are caused to be in alignment with each other so as to help facilitate transport of the flexible substrate through the first and second slots.

In some embodiments, the rear bezel body further includes a mounting plate portion; wherein the mounting plate portion defines a mounting surface configured or designed to enable the rear bezel body to be mounted to a ticket printer device; and wherein the mounting surface includes the first rear opening for receiving the flexible substrate from the ticket printer device.

In some embodiments, the first slot is tapered such that a height of the first rear opening is greater than a height of the first front opening; and wherein the second slot is tapered such that a height of the second rear opening is greater than a height of the second front opening.

In some embodiments, the rear bezel body includes a first projection extending from the rear bezel body, the first projection including a distal end portion which includes the first attachment interface.

In some embodiments, the rear bezel body includes a first projection extending from the rear bezel body, the first projection including a first distal end portion which includes a first part of the first attachment interface; the rear bezel body further includes a second projection extending from the rear bezel body, the second projection including a second distal end portion which includes a second part of the first attachment interface; the front bezel body includes a first part of the second interface disposed at a first side of the front bezel body; and the front bezel body includes a second part of the second interface disposed at a second side of the front bezel body.

In some embodiments, the bezel assembly further comprises an electrical system configured or designed to enable the bezel assembly to be electrically coupled to a plurality of electrical connection interface types, including a first electrical connection interface type and a second electrical connection interface.

In some embodiments, the bezel assembly further comprises an electrical system configured or designed to enable the bezel assembly to be electrically coupled to a plurality of electrical connector interface types, including a three-pin type electrical connector interface type and a four-pin electrical connector interface type.

In some embodiments, the bezel assembly further comprises comprising a plurality of electrical components, including: a circuit board; a first electrical harness electrically connected to the circuit board, the first electrical harness being configured or designed to enable the circuit board to be electrically coupled to a first type of electrical connector interface; and a second electrical harness electrically connected to the circuit board, the second electrical harness being configured or designed to enable the circuit board to be electrically coupled to a second type of electrical connector interface different from the first type of electrical connector interface.

In some embodiments, the bezel assembly further comprises a circuit board; at least one electrical interface electrically coupled to the circuit board; a first electrical harness configured or designed to be removably connected to the circuit board via the at least one electrical interface, the first electrical harness including a first type of electrical connector configured or designed to electrically couple to at least one external device having a first type of electrical connector interface; and a second electrical harness configured or designed to be removably connected to the circuit board via the at least one electrical interface, the second electrical harness including a second type of electrical connector configured or designed to electrically couple to at least one external device having a second type of electrical connector interface; and wherein the first type of electrical connector interface is different from the second type of electrical connector interface.

In some embodiments, the front bezel body and rear bezel body are each separate parts of the bezel assembly.

Additional method(s) and system(s) are described for providing an adjustable printer bezel assembly comprising: a rear bezel body; a front bezel body; means for removably coupling the front bezel body and rear bezel body in a manner which enables the front bezel body and/or rear bezel body to be adjusted to a plurality of different positions or configurations; flexible substrate transport means for facilitating transport of a flexible substrate; and electrical connectivity means for enabling the adjustable printer bezel assembly to be electrically coupled to a plurality of different electrical connector interface types, including a first electrical connection interface type and a second electrical connection interface type which is different from the first electrical connection interface type.

Additional method(s) and system(s) are directed to a gaming machine comprising: a gaming machine cabinet defining an interior cavity, the gaming machine cabinet including a first aperture providing access to the interior cavity; a bezel assembly for dispensing a flexible substrate; the bezel assembly comprising a rear bezel body including a first slot disposed in the rear bezel body, the first slot having a first front opening for outputting the flexible substrate and having a first rear opening for receiving the flexible substrate, the first slot being configured or designed to facilitate transport of the flexible substrate through the first slot, the rear bezel body further including a first attachment interface; the bezel assembly further comprising a front bezel body including a second slot disposed in the front bezel body, the second slot having a second front opening for outputting the flexible substrate and having a second rear opening for receiving the flexible substrate from the first front opening of the rear bezel body, the second slot being configured or designed to facilitate transport of the flexible substrate through the second slot, the front bezel body further including a second attachment interface; and wherein the front bezel body is removably connectable to the rear bezel body via the first and second attachment interfaces.

In some embodiments, the gaming machine further comprises a ticket printer device disposed at the interior cavity; wherein the rear bezel body further includes a mounting plate portion; wherein the mounting plate portion defines a mounting surface configured or designed to enable the rear bezel body to be mounted to the ticket printer device; and wherein the mounting surface includes the first rear opening for receiving the flexible substrate from the ticket printer device.

In some embodiments, the gaming machine further comprises a ticket printer device disposed at the interior cavity; wherein the flexible substrate corresponds to a ticket or voucher which is output from the ticket printer device; wherein the rear bezel body is affixed to the ticket printer device; wherein the front bezel body is attached to the rear bezel body via the first and second attachment interfaces; and wherein the front opening of the front bezel body is configured or designed to interface with the first aperture in a manner which enables the flexible substrate to be transported through the first aperture.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

Specific Example Embodiments

Various techniques will now be described in detail with reference to a few example embodiments thereof as illustrated in the accompanying drawings. In the following description, numerous specific details are set forth in order to provide a thorough understanding of one or more aspects and/or features described or reference herein. It will be apparent, however, to one skilled in the art, that one or more aspects and/or features described or reference herein may be practiced without some or all of these specific details. In other instances, well known process steps and/or structures have not been described in detail in order to not obscure some of the aspects and/or features described or reference herein.

One or more different inventions may be described in the present application. Further, for one or more of the invention(s) described herein, numerous embodiments may be described in this patent application, and are presented for illustrative purposes only. The described embodiments are not intended to be limiting in any sense. One or more of the invention(s) may be widely applicable to numerous embodiments, as is readily apparent from the disclosure. These embodiments are described in sufficient detail to enable those skilled in the art to practice one or more of the invention(s), and it is to be understood that other embodiments may be utilized and that structural, logical, software, electrical and other changes may be made without departing from the scope of the one or more of the invention(s). Accordingly, those skilled in the art will recognize that the one or more of the invention(s) may be practiced with various modifications and alterations. Particular features of one or more of the invention(s) may be described with reference to one or more particular embodiments or figures that form a part of the present disclosure, and in which are shown, by way of illustration, specific embodiments of one or more of the invention(s). It should be understood, however, that such features are not limited to usage in the one or more particular embodiments or figures with reference to which they are described. The present disclosure is neither a literal description of all embodiments of one or more of the invention(s) nor a listing of features of one or more of the invention(s) that must be present in all embodiments.

Headings of sections provided in this patent application and the title of this patent application are for convenience only, and are not to be taken as limiting the disclosure in any way. Devices that are in communication with each other need not be in continuous communication with each other, unless expressly specified otherwise. In addition, devices that are in communication with each other may communicate directly or indirectly through one or more intermediaries. A description of an embodiment with several components in communication with each other does not imply that all such components are required. To the contrary, a variety of optional components are described to illustrate the wide variety of possible embodiments of one or more of the invention(s).

Further, although process steps, method steps, algorithms or the like may be described in a sequential order, such processes, methods and algorithms may be configured to work in alternate orders. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred.

When a single device or article is described, it will be readily apparent that more than one device/article (e.g., whether or not they cooperate) may be used in place of a single device/article. Similarly, where more than one device or article is described (e.g., whether or not they cooperate), it will be readily apparent that a single device/article may be used in place of the more than one device or article. The functionality and/or the features of a device may be alternatively embodied by one or more other devices that are not explicitly described as having such functionality/features. Thus, other embodiments of one or more of the invention(s) need not include the device itself. Techniques and mechanisms described or reference herein will sometimes be described in singular form for clarity. However, it should be noted that particular embodiments include multiple iterations of a technique or multiple instantiations of a mechanism unless noted otherwise.

Although these embodiments are described in sufficient detail to enable one skilled in the art to practice the disclosure, it is understood that these examples are not limiting, such that other embodiments may be used, and changes may be made without departing from the spirit and scope of the disclosure.

Turning first to FIG. 1, an electronic gaming machine ("EGM") 100 according to one embodiment of the present disclosure is illustrated in front perspective view. In various embodiments, methods of game play and presentation can be implemented via a gaming machine or device 100. Such a gaming machine 100 may have various configurations, and again may facilitate the play of wager-based games or other games that are not wager-based. The gaming machine 100 may be located at a casino or other gaming establishment. The gaming machine 100 may be part of a gaming system, such as a casino gaming system which links multiples of the gaming machines, one or more table games, and/or other devices such as kiosks, accounting systems, progressive systems, player tracking systems, respective servers thereof, and the like.

As illustrated, gaming machine 100 generally comprises a physical housing or cabinet for supporting and/or enclosing various components required for operation of the gaming machine. Housing 4 can include a door located at a front thereof, the door capable of being moved between an open position that allows access to the interior, and a closed position where access to the interior is generally prevented. Configurations of the gaming machine 100 may vary. Although gaming machine 100 has an "upright" configuration as shown, alternative configurations, shapes, or dimensions can include a "slant" type, "bar-top" type, "cocktail table" type, and/or other configurations, as are well known to those of skill in the art.

In various embodiments, gaming machine 100 can be configured to present one or more wager-based games upon a player making a monetary payment or wager. In this regard, gaming machine 100 can include means for accepting monetary value or coin in. In various embodiments, certain game outcomes may be designated as winning outcomes. Prizes or awards may be provided for winning outcomes, such as monetary payments (or representations thereof, such as prize of credits), or promotional awards. The gaming machine 100 can also include mean for returning unused monetary funds and/or dispensing winnings to a player, such as by way of physical coins, printed tickets, cash vouchers, electronically stored credits to player accounts, and the like.

In the specific example embodiment of FIG. 1, machine 100 includes a main cabinet 4, which generally surrounds the machine interior and is viewable by users. Mounted to the cabinet 4 is a button panel 6 with player-input switches or buttons and/or other input devices for a player to play games on the machine 100, such as, for example, place bets, and otherwise interact with the machine to play a game. The button panel 6 extends outward from the front of the cabinet 4. In some embodiments, the gaming machine 100 may also include a coin acceptor and a coin tray.

The gaming machine 100 has at least one door or access panel on the front side of the cabinet. For example, gaming machine 100 may include a door which forms part of the main video display 8 such as a high-resolution, flat-panel liquid crystal display (LCD). In some embodiments, the EGM may include a secondary video display 10 which may be configured or designed to display information relating to various aspects of wager-based game play and/or other content. The main display 8 is configured to display video output data and other game information for games played on the machine 100. According to different embodiments, main display 8 can be a cathode ray tube (CRT), high resolution flat-panel LCD, or other conventional electronically controlled video monitor. The secondary display 10 can also be a flat-panel display, or a back-lit, silk screened glass panel with lettering to indicate general game information including, for example, a game denomination (e.g., $0.25 or $1). In at least some embodiments, the gaming machine 100 may also include a player tracking module. In one embodiment, the player tracking module may include a key pad for entering player tracking information, a display for displaying player tracking information, and a card reader or RFID reader for entering a magnetic striped card or RFID card containing player tracking information.

In at least some embodiments, the EGM may include one or more interfaces configured or designed to provide player tracking services and other game services to a player playing a game on the gaming machine 100. For example, in one embodiment, one or more EGM interfaces may be configured or designed to facilitate, enable, initiate, and/or perform one or more of the following: 1) input player tracking identification information, 2) view account information and perform account transactions for accounts such as player tracking accounts and bank accounts, 3) receive operating instructions, 4) redeem prizes or comps including using player tracking points to redeem the prize or comp, 5) make entertainment service reservations, 6) transfer credits to cashless instruments and other player accounts, 7) participate in casino promotions, 8) select entertainment choices for output via video and audio output mechanisms, 9) play games and bonus games, 10) request gaming services such as drink orders, 11) communicate with other players or casino service personnel and 12) register a player for a loyalty program such as a player tracking program. In addition, in at least some embodiments, one or more EGM interfaces may be used by casino service personnel to: a) access diagnostic menus, b) display player tracking unit status information and gaming machine status information, c) access gaming machine metering information and d) display player status information.

Many different types of games, including mechanical slot games, video slot games, video poker, video blackjack, video pachinko and lottery, may be provided on gaming machine 100. The gaming machine 100 is operable to provide play of many different instances of games of chance. The instances may be differentiated according to themes, sounds, graphics, type of game (e.g., slot game vs. card game), denomination, number of paylines, maximum jackpot, progressive or non-progressive, bonus games, etc. The gaming machine 100 may be operable to allow a player to select a game of chance to play from a plurality of instances available on the gaming machine. For example, the gaming machine may provide a menu with a list of the instances of games that are available for play on the gaming machine and a player may be able to select from the list a first instance of a game of chance that they wish to play.

The various instances of games available for play on the gaming machine 100 may be stored as game software on a mass storage device in the gaming machine or may be generated on a remote gaming device but then displayed on the gaming machine. The gaming machine 100 may execute game software, such as but not limited to video streaming software that allows the game to be displayed on the gaming machine. When an instance is stored on the gaming machine 100, it may be loaded from the mass storage device into a RAM for execution. In some cases, after a selection of an instance, the game software that allows the selected instance to be generated may be downloaded from a remote gaming device, such as another gaming machine.

In the specific example embodiment of FIG. 1, EGM 100 includes a bill validator and ticket printer, which are both securely disposed within the interior of EGM cabinet. An interface portion of a bill validator 30, and an interface portion of a ticket printer 18 are exposed through holes or apertures in the EGM cabinet. The ticket printer 18 may be used to print tickets 20 for a cashless ticketing system (e.g., TITO tickets or vouchers). As illustrated in the example embodiment of FIG. 1, the tickets or vouchers are discharged from the ticket printer via a front bezel portion. In at least one embodiment, the ticket printer is configured or designed to print bar-coded tickets or vouchers 20 indicating an amount of currency or credit.

The bill validator 30, button panel 6, video display 8, and ticket printer 18 are used to enable wager-based gameplay at the EGM 100. The devices are controlled by circuitry, including a master gaming controller, housed inside the main cabinet 4 of the machine 100. When a user wishes to play the gaming machine 100, he or she inserts cash through the coin acceptor or bill validator 30. Additionally, the bill validator may accept a printed ticket voucher, which can also be accepted by the bill validator 30 as indicia of credit when a cashless ticketing system is used.

Understand that gaming machine 100 is but one example from a wide range of gaming devices on which the present invention may be implemented. Also, a game may be generated on a host computer and may be displayed on a remote terminal or a remote gaming device. The remote gaming device may be connected to the host computer via a network of some type such as a local area network, a wide area network, an intranet or the Internet, by a wired or wireless connection. The remote gaming device may be a portable gaming device such as but not limited to a cell phone, a personal digital assistant, and a wireless game player. Images rendered from 3-D gaming environments may be displayed on portable gaming devices that are used to play a game of chance. Further, a gaming machine or server may include gaming logic for commanding a remote gaming device to render an image from a virtual camera in a 3-D gaming environment stored on the remote gaming device and to display the rendered image on a display located on the remote gaming device. Thus, those of skill in the art will understand that the present invention, as described below, can be deployed on most any gaming machine now available or hereafter developed.

Some gaming machines are implemented with special features and/or additional circuitry that differentiates them from general-purpose computers (e.g., desktop personal computers and laptops). Gaming machines are highly regulated to ensure fairness and, in many cases, gaming machines are operable to dispense monetary awards of multiple millions of dollars. Therefore, to satisfy security and regulatory requirements in a gaming environment, hardware and software architectures may be implemented in gaming machines that differ significantly from those of general-purpose computers. A description of gaming machines relative to general-purpose computing machines and some examples of the additional (or different) components and features found in gaming machines are described below.

At first glance, one might think that adapting PC technologies to the gaming industry would be a simple proposition because both PCs and gaming machines employ microprocessors that control a variety of devices. However, because of such reasons as 1) the regulatory requirements that are placed upon gaming machines, 2) the harsh environment in which gaming machines operate, 3) security requirements, and 4) fault tolerance requirements, adapting PC technologies to a gaming machine can be quite difficult. Further, techniques and methods for solving a problem in the PC industry, such as device compatibility and connectivity issues, might not be adequate in the gaming environment. For instance, a fault or a weakness tolerated in a PC, such as security holes in software or frequent crashes, may not be tolerated in a gaming machine because in a gaming machine these faults can lead to a direct loss of funds from the gaming machine, such as stolen cash or loss of revenue when the gaming machine is not operating properly.

For the purposes of illustration, a few differences between PC systems and gaming systems will be described. A first difference between gaming machines and common PC based computers systems is that gaming machines are designed to be state-based systems. In a state-based system, the system stores and maintains its current state in a non-volatile memory, such that, in the event of a power failure or other malfunction the gaming machine will return to its current state when the power is restored. For instance, if a player was shown an award for a game of chance and, before the award could be provided to the player the power failed, the gaming machine, upon the restoration of power, would return to the state where the award is indicated. This requirement affects the software and hardware design on a gaming machine. As anyone who has used a PC knows, PCs are not state machines and a majority of data is usually lost when such a malfunction occurs.

A second important difference between gaming machines and common PC based computer systems is that for regulation purposes, the software on the gaming machine used to generate the game of chance and operate the gaming machine has been designed to be static and monolithic to prevent cheating by the operator of the gaming machine. For instance, one solution that has been employed in the gaming industry to prevent cheating and satisfy regulatory requirements has been to manufacture a gaming machine that can use a proprietary processor miming instructions to generate the game of chance from an EPROM or other form of nonvolatile memory. The coding instructions on the EPROM are static (non-changeable) and must be approved by a gaming regulator in a particular jurisdiction and installed in the presence of a person representing the gaming jurisdiction. Any changes to any part of the software required to generate the game of chance, such as adding a new device driver used by the master gaming controller to operate a device during generation of the game of chance can require a new EPROM to be burned, approved by the gaming jurisdiction and installed on the gaming machine in the presence of a gaming regulator. Regardless of whether the EPROM solution is used, to gain approval in most gaming jurisdictions, a gaming machine must demonstrate sufficient safeguards that prevent an operator or player of a gaming machine from manipulating hardware and software in a manner that gives them an unfair and in some cases an illegal advantage. The gaming machine should have a means to determine if the code it will execute is valid. If the code is not valid, the gaming machine must have a means to prevent the code from being executed. The code validation requirements in the gaming industry affect both hardware and software designs on gaming machines.

A third important difference between gaming machines and common PC based computer systems is that the number and kinds of peripheral devices used on a gaming machine are not as great as on PC based computer systems. Traditionally, in the gaming industry, gaming machines have been relatively simple in the sense that the number of peripheral devices and the number of functions of the gaming machine have been limited. Further, in operation, the functionality of gaming machines were relatively constant once the gaming machine was deployed, i.e., new peripherals devices and new gaming software were infrequently added to the gaming machine. This differs from a PC where users will buy different combinations of devices and software from different manufacturers and connect them to a PC to suit their needs depending on a desired application. Therefore, the types of devices connected to a PC may vary greatly from user to user depending in their individual requirements and may vary significantly over time.

Although the variety of devices available for a PC may be greater than on a gaming machine, gaming machines still have unique device requirements that differ from a PC, such as device security requirements not usually addressed by PCs. For instance, monetary devices, such as coin dispensers, bill validators, ticket printers and computing devices that are used to govern the input and output of cash to a gaming machine have security requirements that are not typically addressed in PCs. Therefore, many PC techniques and methods developed to facilitate device connectivity and device compatibility do not address the emphasis placed on security in the gaming industry.

To address some of the issues described above, a number of hardware/software components and architectures are utilized in gaming machines that are not typically found in general purpose computing devices, such as PCs. These hardware/software components and architectures, as described below in more detail, include but are not limited to watchdog timers, voltage monitoring systems, state-based software architecture and supporting hardware, specialized communication interfaces, security monitoring and trusted memory. Additionally, at least some EGM embodiments may be configured or designed to include unique interfaces, including serial interfaces, to connect to specific subsystems internal and external to the slot machine. The serial devices may have electrical interface requirements that differ from the "standard" EIA 232 serial interfaces provided by general-purpose computers. These interfaces may include EIA 485, EIA 422, Fiber Optic Serial, optically coupled serial interfaces, current loop style serial interfaces, etc. In addition, to conserve serial interfaces internally in the slot machine, serial devices may be connected in a shared, daisy-chain fashion where multiple peripheral devices are connected to a single serial channel.

In at least some embodiments, the serial interfaces may be used to transmit information using communication protocols that are unique to the gaming industry. For example, SAS is a communication protocol used to transmit information, such as metering information, from a gaming machine to a remote device. Often SAS is used in conjunction with a player tracking system.

In at least some embodiments, the EGM may be treated as peripheral devices to a casino communication controller and connected in a shared daisy chain fashion to a single serial interface. The peripheral devices may preferably be assigned device addresses. In some embodiments, the serial controller circuitry may be configured or designed to implement a method to generate or detect unique device addresses. General-purpose computer serial ports are not able to do this.

The EGM may also include security monitoring circuits configured or designed to detect intrusion into the gaming machine by monitoring security switches attached to access doors in the slot machine cabinet. Preferably, access violations result in suspension of game play and can trigger additional security operations to preserve the current state of game play. These circuits also function when power is off by use of a battery backup. In power-off operation, these circuits continue to monitor the access doors of the slot machine. When power is restored, the gaming machine can determine whether any security violations occurred while power was off, e.g., via software for reading status registers. This can trigger event log entries and further data authentication operations by the slot machine software.

Trusted memory devices are preferably included as part of the EGM hardware to ensure the authenticity of the software that may be stored on less secure memory subsystems, such as mass storage devices. Trusted memory devices and controlling circuitry are typically designed to not allow modification of the code and data stored in the memory device while the memory device is installed in the slot machine. The code and data stored in these devices may include authentication algorithms, random number generators, authentication keys, operating system kernels, etc. The purpose of these trusted memory devices is to provide gaming regulatory authorities a root trusted authority within the computing environment of the slot machine that can be tracked and verified as original. This may be accomplished via removal of the trusted memory device from the slot machine computer and verification of the secure memory device contents in a separate third party verification device. Once the trusted memory device is verified as authentic, and based on the approval of the verification algorithms contained in the trusted device, the gaming machine is allowed to verify the authenticity of additional code and data that may be located in the gaming computer assembly, such as code and data stored on hard disk drives.

Mass storage devices used in a general purpose computer typically allow code and data to be read from and written to the mass storage device. In a gaming machine environment, modification of the gaming code stored on a mass storage device is strictly controlled and would only be allowed under specific maintenance type events with electronic and physical enablers required. Though this level of security could be provided by software, EGMs which include mass storage devices preferably include hardware level mass storage data protection circuitry that operates at the circuit level to monitor attempts to modify data on the mass storage device and will generate both software and hardware error triggers should a data modification be attempted without the proper electronic and physical enablers being present.

In at least one embodiment, at the start of the game, the player may enter playing tracking information via a player tracking interface. Further, other game preferences of the player playing the game may be read from a card inserted into a card reader. During the game, the player views game information using the video display 8. During the course of a game, a player may be required to make a number of decisions, which affect the outcome of the game. For example, a player may vary his or her wager on a particular game, select a prize for a particular game selected from a prize server, or make game decisions which affect the outcome of a particular game. The player may make these choices using the player-input buttons of the button panel 6, the video display screen 8, and/or using some other device which enables a player to input information into the gaming machine. In some embodiments, the player may be able to access various game services such as concierge services and entertainment content services using the video display screen 8, and/or one or more other EGM interface(s). After the player has completed a game, the player may receive a cashless ticket or voucher 20 from the ticket printer interface 18, which may be used for further games or to redeem a prize. In some embodiments, the player may receive a ticket 20 for food, merchandise, or games from the printer interface 18.

Figure 2:
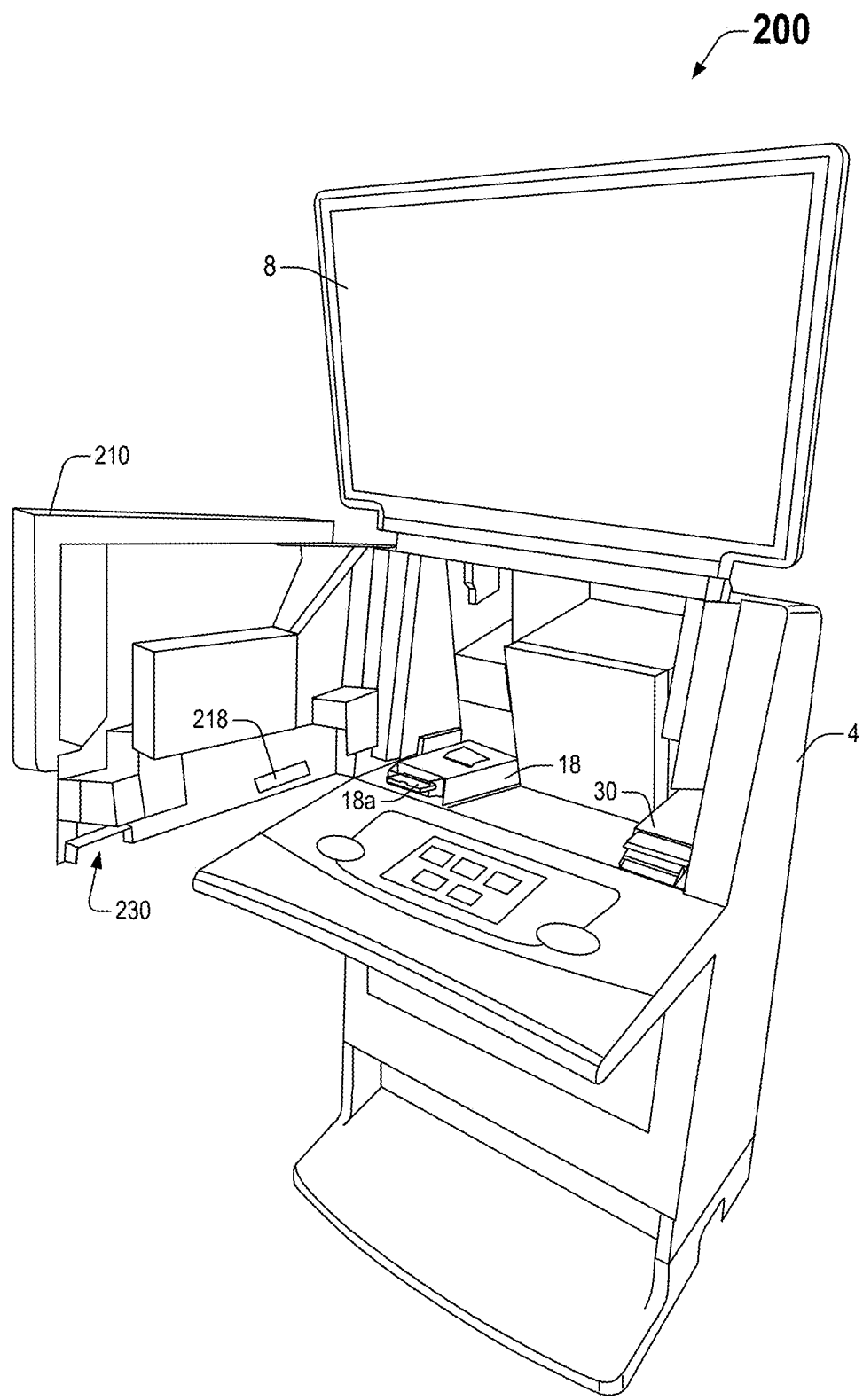
FIG. 2 is a diagram of the gaming machine 100 with open doors, constructed according to one embodiment.

FIG. 2 is a diagram of gaming machine 100 with the main display door 210 in an opened position, thereby exposing interior spaces of the EGM cabinet 4. In the specific example embodiment of FIG. 2, the main display door 210 is designed to open in a hinged manner to provide access to commonly-serviced peripheral components such as bill acceptor 30, ticket printer 18, and other peripherals. When the main display door 210 is closed, it defines an enclosed interior space in which the bill acceptor 30 and the printer 18 are situated. Apertures 218, 230 in the main display door 210 are designed to align with the front interfaces of the ticket printer 18 and bill validator 30, respectively (e.g., when the main display door is in a closed position), to thereby provide players and casino personnel with access to the ticket printer and bill validator interfaces. As illustrated in the example embodiment of FIG. 2, the front bezel portion 18*a* of the ticket printer remains attached to the ticket printer device body 18 when the main display door 210 is in its "open" position.

As noted previously, various problems may be encountered when designing the ticket printer aperture of a gaming cabinet to support a variety of different ticket printers/bezels from different ticket printer manufacturers. Examples of such problems may include undesirable gaps between the ticket bezel and the gaming machine cabinet opening. Other problems may relate to undesirable mismatches or discontinuities between the exterior surface of the gaming machine cabinet and exposed portion(s) of the printer ticket bezel.

In an effort to mitigate or resolve the various problems and issues relating to currently existing gaming cabinet designs and ticket printer bezel designs, various aspects described herein are directed to different types of universal adjustable printer bezel designs, components, and features, as illustrated, for example, in FIGS. 3-23.

FIGS. 3-5, 6A, 6B, 7A, 7B, 8A, 8B, 9A, 9B, 10A, 10B, and 11-25 illustrate example embodiments of different types of universal adjustable printer bezels and components thereof.

FIG. 3 illustrates an example embodiment of a universal adjustable printer bezel assembly 300. In at least one embodiment, the universal adjustable printer bezel assembly 300 is specifically configured or designed to be compatible for use with a plurality of different ticket printer models produced by different ticket printer manufacturers. Because the universal adjustable printer bezel assembly is designed to be compatible for use with a plurality of different ticket printer models produced by different ticket printer manufacturers, gaming machine manufacturers now have the option of incorporating the universal adjustable printer bezel assembly 300 into their gaming cabinet designs, thereby avoiding the need to utilize different ticket printer bezels from different ticket printer manufacturers. Moreover, by incorporating the universal adjustable printer bezel assembly 300 into their gaming cabinet designs, gaming machine manufacturers are able to design and manufacture gaming machines which offer support for a variety of different ticket printer models from different ticket printer manufactures, while avoiding many of common problems and issues which may arise due to the differences in the design specifications of the different ticket printer bezels produced by the different ticket printer manufacturers.

FIG. 4 illustrates an exploded perspective view of a universal adjustable printer bezel assembly embodiment 400. By way of illustration, the universal adjustable printer bezel assembly embodiment 400 of FIG. 4 corresponds to an exploded view of the universal adjustable printer bezel assembly 300 of FIG. 3.

As illustrated in the example embodiment of FIG. 4, the universal adjustable printer bezel assembly 400 may be configured or designed to include a plurality of different features and components, including, but not limited to, one or more of the following (or combinations thereof):

Rear Bezel Assembly Portion 410.
Front Bezel Assembly Portion 420.
Electrical Assembly Portion 430.
Etc.

As illustrated in the example embodiment of FIG. 4, Rear Bezel Assembly Portion 410 may include, but is not limited to, one or more of the following (or combinations thereof):

Mounting plate 402. According to different embodiments, the size and shape and mounting holes 402*a* may be designed to be compatible with the front faces of different ticket printer models from different ticket printer manufacturers.

Rear body interface portion 403, which, in the specific example embodiment of FIG. 4, is comprised of a convex, semi-cylindrical or semi-ovular shaped body affixed to the mounting plate, and is designed to interface with front body interface portion 422 of the front bezel assembly portion 420.

Slot 407, which is disposed in the rear body interface portion, and configured or designed to allow a ticket or voucher to pass through the slot. In at least one embodiment, the slot 407 corresponds to a distal end of a tapered opening or passage within the body of the rear bezel assembly portion, which extends from mounting plate 402 to the distal end of the rear body interface portion where slot 407 is located.

Adjustment arms 404. As illustrated in the example embodiment of FIG. 4 adjustment arms 404 may be directly affixed to the mounting plate, or may be indirectly affixed to the mounting plate, for example, by being affixed to rear body interface portion 403 which is affixed to the mounting plate (or forms part of the mounting plate body). As illustrated in the example embodiment of FIG. 4 adjustment arms 404 may each include a plurality of adjustment arm holes 405, which provide functionality for enabling the front bezel assembly portion 420 to be adjusted to a plurality of different angular positions or configurations, as illustrated, for example, in FIGS. 6-10.

As illustrated in the example embodiment of FIG. 4, Front Bezel Assembly Portion 420 may include, but is not limited to, one or more of the following (or combinations thereof):

Front body interface portion 422, which, in the specific example embodiment of FIG. 4, is designed to have a concave surface 422*a* for interfacing with the convex surface of rear body interface portion 403. In at least one embodiment, the shapes and curvatures of the front body interface portion 422 and rear body interface portion 403 are preferably configured or designed to form an adjustable interface to allow the angular position of the front bezel assembly portion 420 to be adjusted relative to the angular position of the rear bezel assembly portion 410, thereby providing functionality for enabling the front bezel assembly portion 420 and/or rear bezel assembly portion 410 to be adjusted to a plurality of different angular positions, as illustrated, for example, in FIGS. 6-10.

Screw bosses 423 which are configured or designed to function as mounting regions for enabling mounting of one or more electrical board or printed circuit boards (e.g., 432) to the front bezel assembly portion 420. In at least one embodiment, the screw bosses 423 are configured or designed for attaching fasteners such as screws or for accepting threaded inserts.

Pin or detent portion 424, which, for example, is configured or designed to removably interface with different holes 405 of the adjustment arms 404, as illustrated, for example, in FIGS. 6-10, thereby enabling the front bezel assembly portion 420 and/or rear bezel assembly portion 410 to be adjusted to a plurality of different angular positions. In at least some embodiments, the front bezel assembly portion includes two pins or detent portions 424, which are disposed on opposite sides of the front body interface portion 422 (as illustrated, for example, in FIGS. 20 and 21 of the drawings). The rear bezel assembly portion 410 may be securely and removably attached to the front bezel assembly portion 420, for example, by engaging the holes 405 of the adjustment arms 404 with the respective pins/detents 424.

Flange portion 426. In at least one embodiment, flange portion 426 may be configured or designed to serve as a physical barrier to help prevent persons and objects from accessing the interior of the cabinet via the ticket printer aperture 218 (FIG. 2).

Front chute or nose portion 428, which includes a chute or slot 429 for enabling printed tickets or vouchers to pass through it. In at least one embodiment, the slot 429 corresponds to a distal end of a tapered opening or passage within the body of the front bezel assembly portion, which extends from the distal end 422a of front body interface portion to the distal end of nose portion 428 where slot 429 is located. In at least some embodiments, the front chute or nose portion 428 is configured or designed to protrude out from the ticket printer aperture 218, thereby providing player access to the printed tickets or vouchers output from the ticket printer via the universal adjustable printer bezel assembly.

As illustrated in the example embodiment of FIG. 4, Electrical Assembly Portion 430 may include, but is not limited to, one or more of the following (or combinations thereof):

Circuit board 432, which, for example, may be configured or designed to include various component(s) and/or circuitry for facilitating or controlling electrical connections between components of the universal adjustable printer bezel assembly and ticket printer devices.

LEDs 434, which, for example may be used to illuminate portions of the front bezel assembly portion 420.

One or more electrical harnesses and/or connectors 436a, 436b which are configured or designed to be compatible with, and electrically coupled to different types of ticket printer models from different ticket printer manufacturers.

Figure 24:
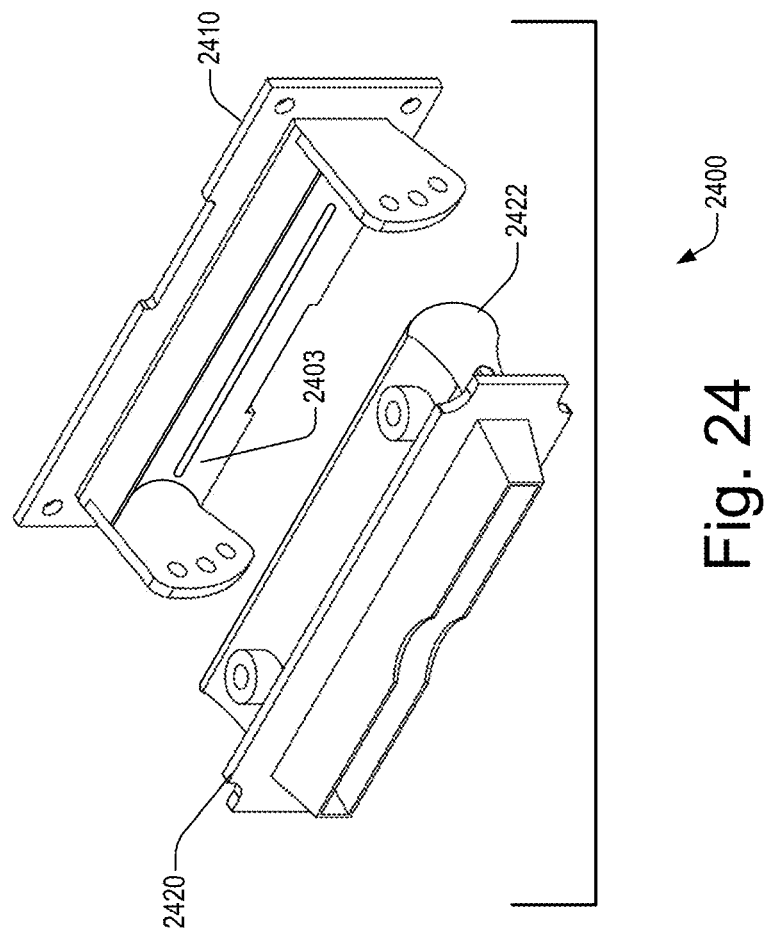

It will be appreciated that in alternate embodiments of the universal adjustable printer bezel assembly, such as that illustrated in FIG. 24, for example, the rear bezel assembly portion 2410 may include a front body interface portion 2403 having a concave surface, and front bezel assembly portion 2420 may include a rear body interface portion 2422 having a convex surface. According to different embodiments, the shapes and curvatures of the front body interface portion and rear body interface portion are preferably configured or designed to form an adjustable interface to allow the angular position of the front bezel assembly portion 2422 to be adjusted relative to the angular position of the rear bezel assembly portion 2410, thereby providing functionality for enabling the front bezel assembly portion 2420 to be adjusted to a plurality of different angular positions, as illustrated, for example, in FIGS. 6-10.

Figure 18:
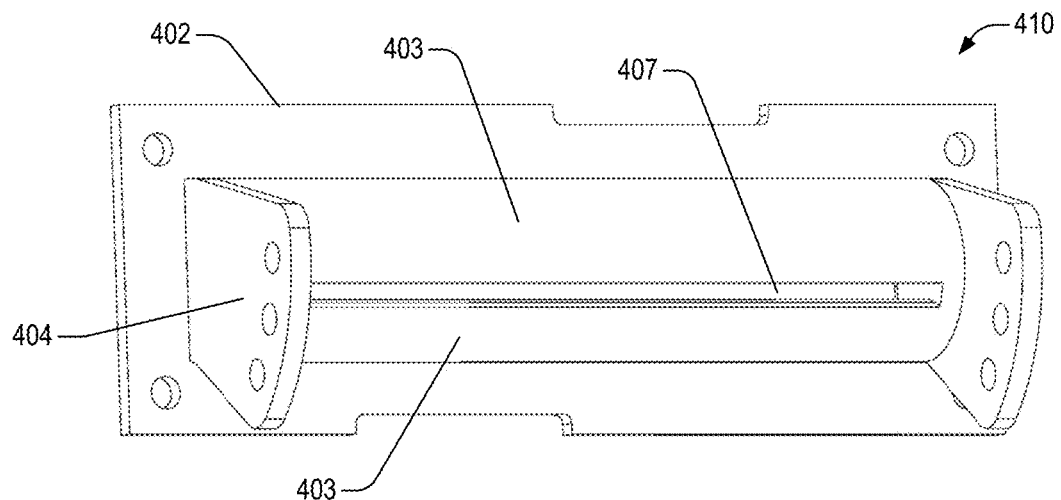
Figure 19:
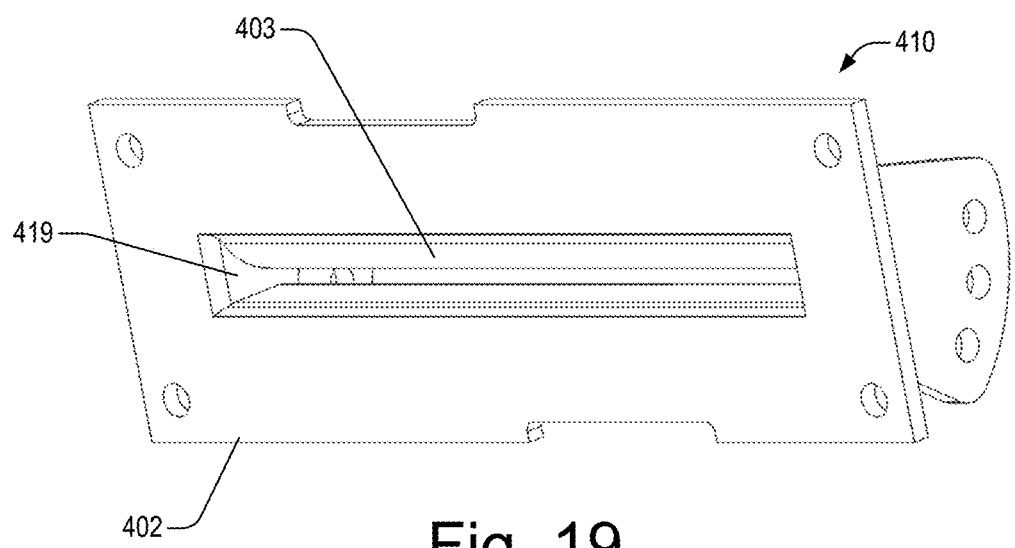

Similarly, it will be appreciated that in some alternate embodiments of the universal adjustable printer bezel assembly (not shown), the adjustment arms 424 may be configured or designed to include one or more pin or detent portions (e.g., replacing the holes 405), and the front body interface portion 422 may be configured or designed to include one or more recesses or cavities (e.g., replacing the pin/detent portions 424). The front bezel assembly portion may be movably attached to the rear bezel assembly portion by engaging the pins of the adjustment arms with the cavities located on the front body interface portion, thereby enabling the front bezel assembly portion and/or rear bezel assembly portion to be adjusted to a plurality of different angular positions FIG. 18 shows a front perspective view of the rear bezel assembly portion 410 illustrated in FIG. 4. FIG. 19 shows a rear perspective view of the rear bezel assembly portion 410 illustrated in FIG. 4. As illustrated in the example embodiment of FIG. 19, rear bezel assembly portion 410 includes a tapered opening or passage 419 in mounting plate 402, which extends from mounting plate 202 to slot portion 407, and which is configured or designed to help guide transport of printed tickets or vouchers as they pass through the universal adjustable printer bezel assembly.

Figure 20:
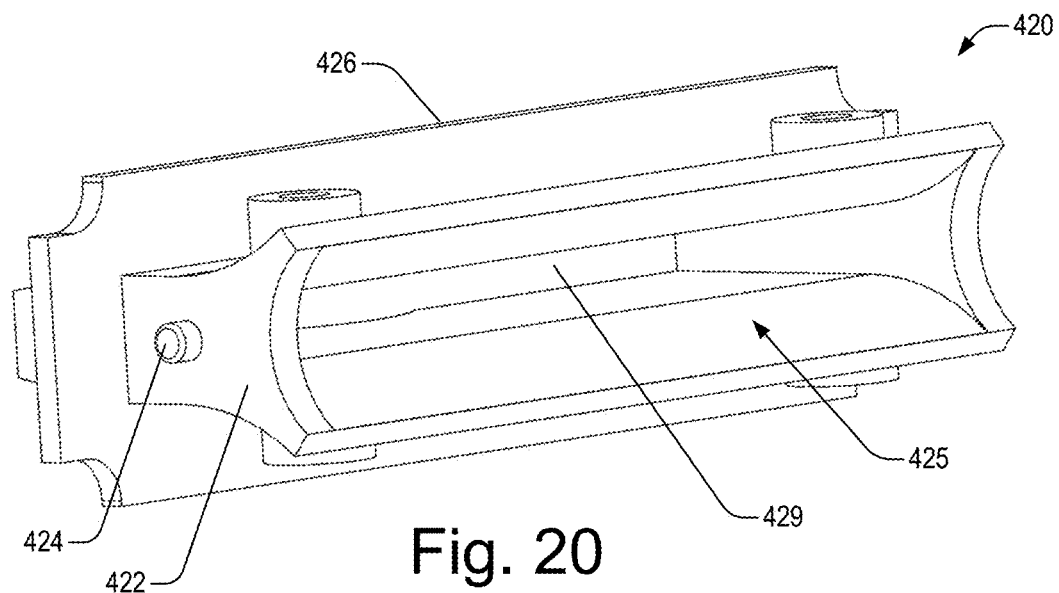
Figure 21:
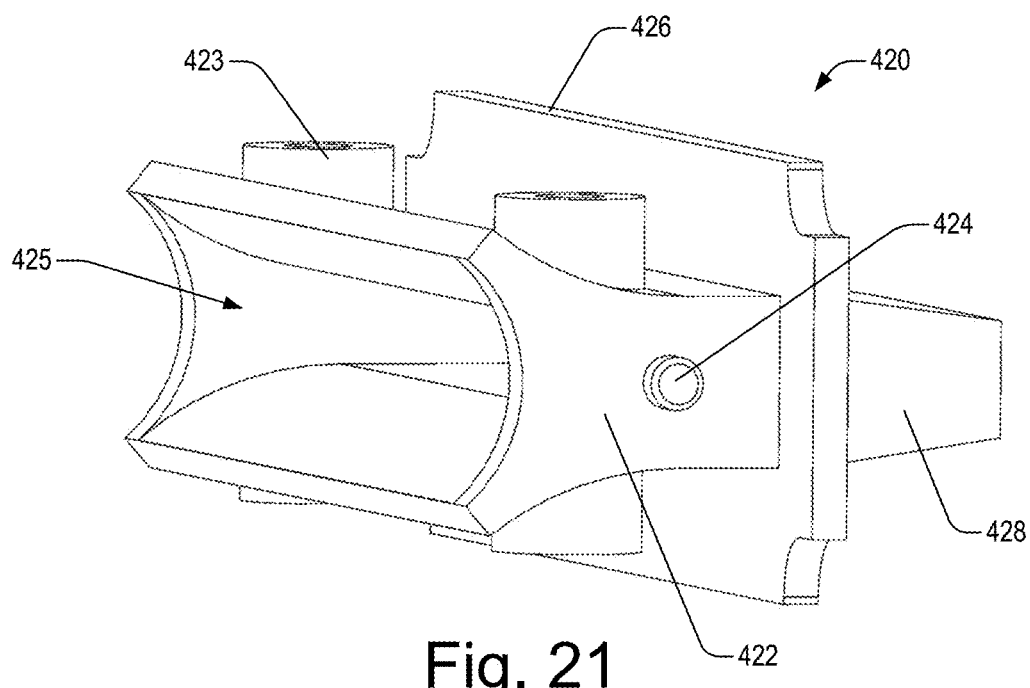

FIG. 20 shows a left rear perspective view of the front bezel assembly portion 420 illustrated in FIG. 4. FIG. 21 shows a right rear perspective view of the front bezel assembly portion 420 illustrated in FIG. 4. As illustrated in FIGS. 20 and 21, front bezel assembly portion 420 includes a tapered opening or passage 425 in front body interface portion 422, which is configured or designed to help guide transport of printed tickets or vouchers as they pass through the universal adjustable printer bezel assembly.

Figure 22:
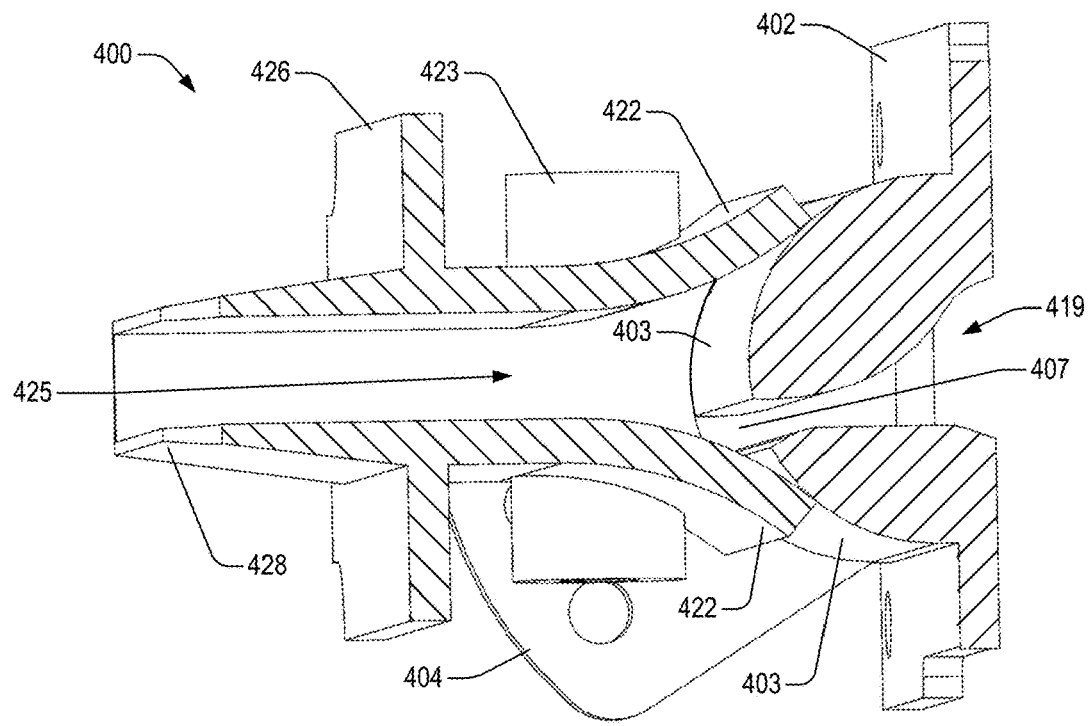
Figure 23:
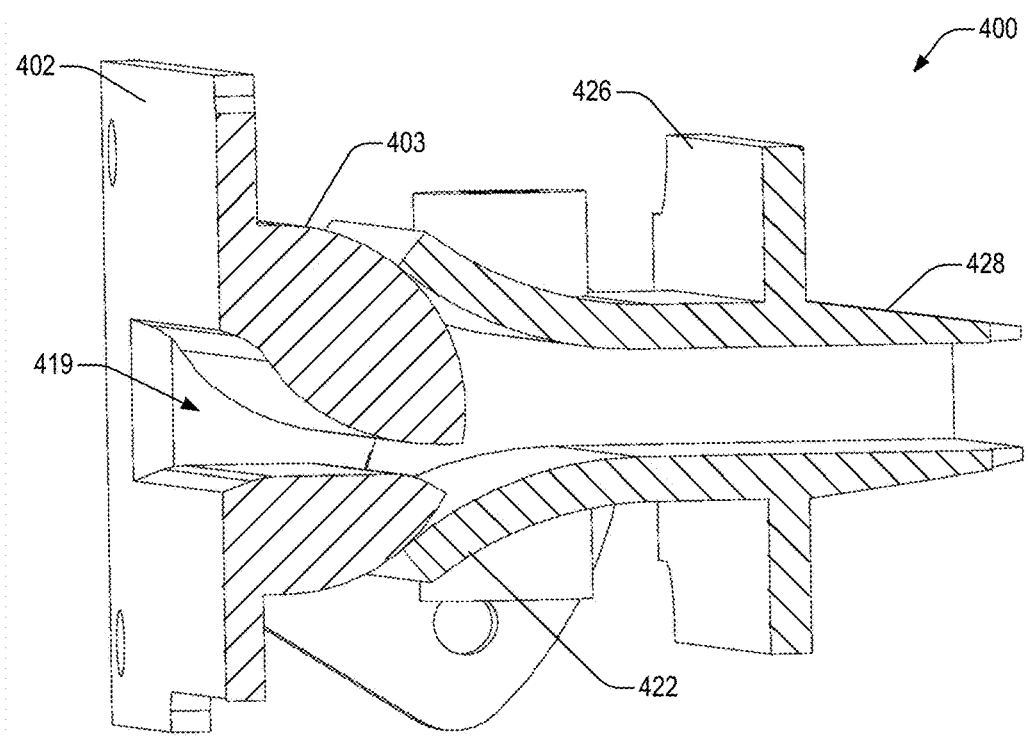

FIG. 22 shows a front perspective cross sectional view of the universal adjustable printer bezel assembly 400 illustrated in FIG. 3, taken along line A-A. FIG. 23 shows a rear perspective cross sectional view of the universal adjustable printer bezel assembly 400 illustrated in FIG. 3, taken along line A-A. For purposes of clarity and simplification, the electrical assembly portion 430 has been omitted from the cross sectional views of FIGS. 22 and 23.

As illustrated in the example embodiment of FIGS. 22 and 23, the shapes and curvatures of the front body interface portion 422 and rear body interface portion 403 are preferably configured or designed to form a movable or pivotable interface to allow the position of the front bezel assembly portion 420 to be moved or adjusted relative to the position of the rear bezel assembly portion 410, thereby providing functionality for enabling the front bezel assembly portion 420 and/or rear bezel assembly portion 410 to be adjusted to a plurality of different angular positions. Additionally, as illustrated in FIGS. 22 and 23, the shapes and design features of the tapered openings or tapered passages extending through the rear bezel assembly portion (e.g., as indicated at 419) and front bezel assembly portion (e.g., as indicated at 425) help guide transport of printed tickets or vouchers as they pass through the universal adjustable printer bezel assembly.

According to different embodiments, various universal adjustable printer bezel assembly embodiments disclosed herein may include a plurality of different compatibility features, which provide a number of benefits and advantages over conventional printer ticket bezels. Examples of such compatibility features may include, but are not limited to, one or more of the following (or combinations thereof):

Mounting plate compatibility features which provide the ability for the universal adjustable printer bezel assembly to be compatible with, and properly mounted onto the front faces of different ticket printer models from different ticket printer manufacturers.

Adjustable bezel angle features which provide the ability for the angle or position of the front bezel assembly portion (e.g., 420, FIG. 4) and/or rear bezel assembly portion (e.g., 410, FIG. 4) to be dynamically adjusted (as desired), for example, to conform with sloped surfaces of exterior portion(s) of gaming cabinets, etc.

Electrical connectivity compatibility features which provide the ability for the universal adjustable printer bezel assembly to be compatible with, and electrically connected or coupled to different ticket printer models from different ticket printer manufacturers.

By way of illustration, one of the issues which gaming machine manufacturers often face relates to the incompatibility of ticket printer components manufactured by different ticket printer manufacturers. For example, many of today's ticket printer manufacturers also manufacture ticket printer bezels which are specifically configured or designed to be compatible with the customized and/or proprietary design specifications and interfaces of that manufacturer's ticket printer devices. However, in many situations, the ticket printer bezels which are produced by one ticket printer manufacturer are not compatible for use with the ticket printer devices of a different ticket printer manufacturer, and vice versa. For example, ticket printer manufacturer A may utilize a four pin type electrical connector to electrically couple the components of its ticket printer bezels (e.g., such as, for example, circuit board, LEDs, etc.) to the main body of its ticket printer devices, whereas ticket printer manufacturer B may utilize a three pin type electrical connector to electrically couple the components of its ticket printer bezels to the main body of its ticket printer devices. As a result, the ticket printer bezel manufactured by ticket printer manufacturer A is not compatible for use with ticket printer device manufactured by ticket printer manufacturer B, and vice versa. However, such incompatibility issues have typically not been a major concern to ticket printer manufacturers, since there has not been a significant need or desire by a ticket printer manufacturer to use ticket printer bezels manufactured by other ticket printer manufacturers.

However, one of the benefits and advantages of the universal adjustable printer bezel assembly disclosed herein is that, in at least some embodiments, the universal adjustable printer bezel assembly is configured or designed to include electrical connectivity compatibility features which provide the ability for the universal adjustable printer bezel assembly to be compatible with, and electrically coupled to, various different ticket printer models from different ticket printer manufacturers. An illustrative example of this is discussed with respect to FIG. 5.

Figure 5:
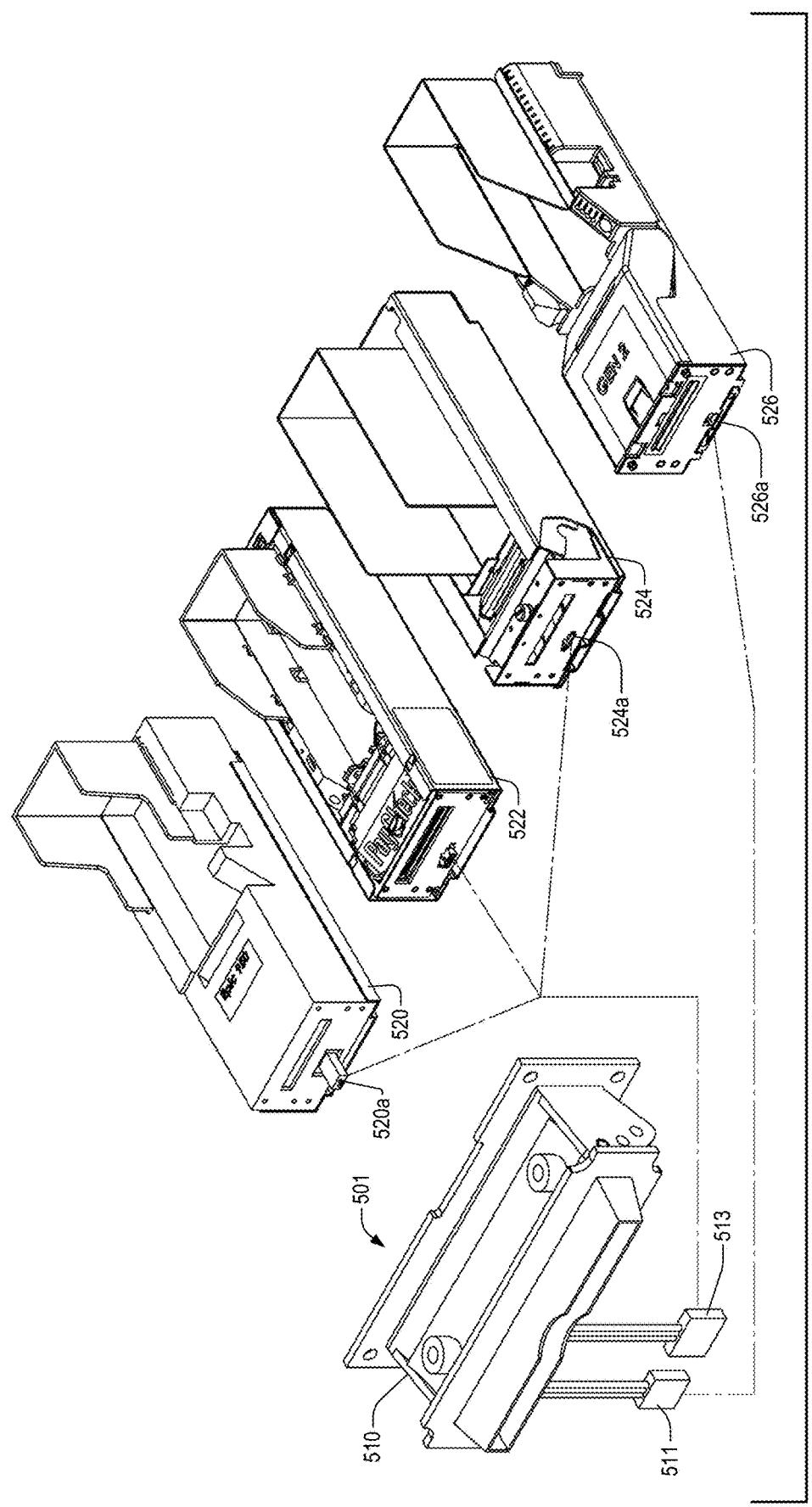

FIG. 5 shows an illustrative example embodiment of a universal adjustable printer bezel assembly 501 is configured or designed to include electrical connectivity compatibility features which enable it to be compatible with, and electrically coupled to, various different ticket printer models from different ticket printer manufacturers. In the specific example embodiment of FIG. 5, four different types of ticket printer models from different ticket printer manufacturers are indicated by reference numbers 520, 522, 524, 526. For purposes of illustration, it is assumed in this particular example that 3 of the ticket printer units (e.g., 520, 522, 524) utilize a four pin type electrical connector for electrically coupling to the electrical harness of a ticket printer bezel, and that a different one of the ticket printer units (e.g., 526) utilizes a three pin type electrical connector for electrically coupling to the electrical harness of a ticket printer bezel.

Figure 14:
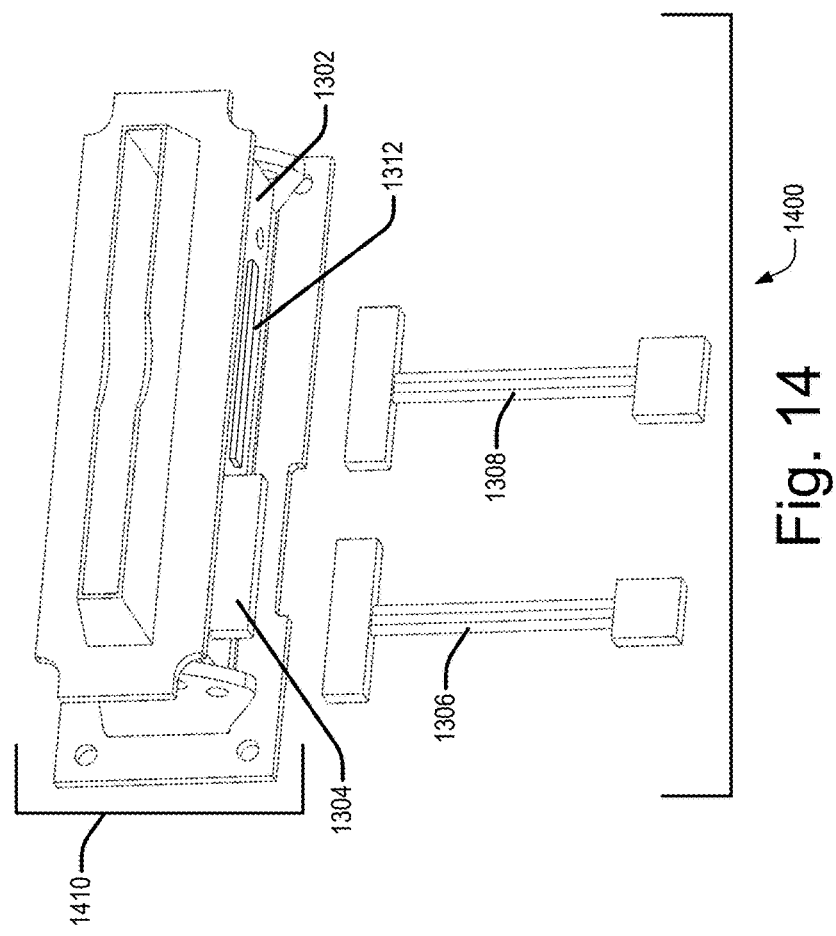
Figure 13:
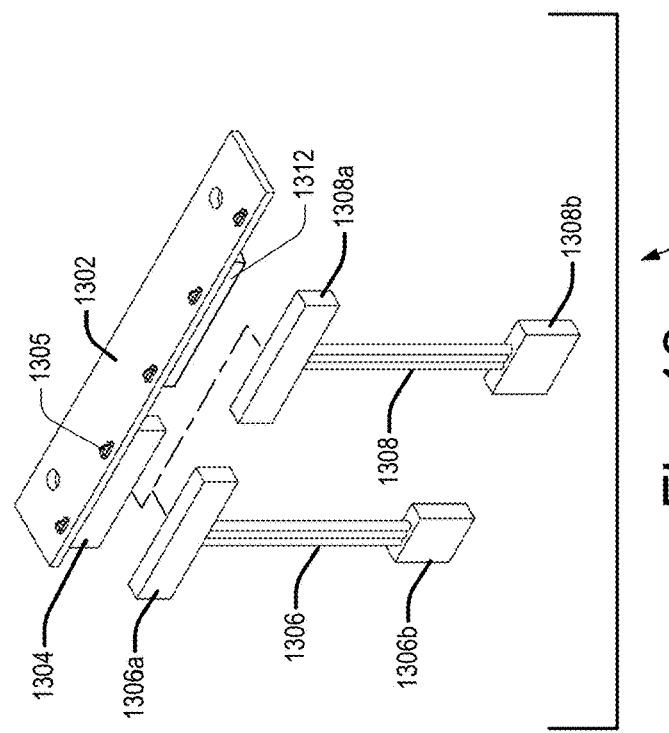
Figure 15:
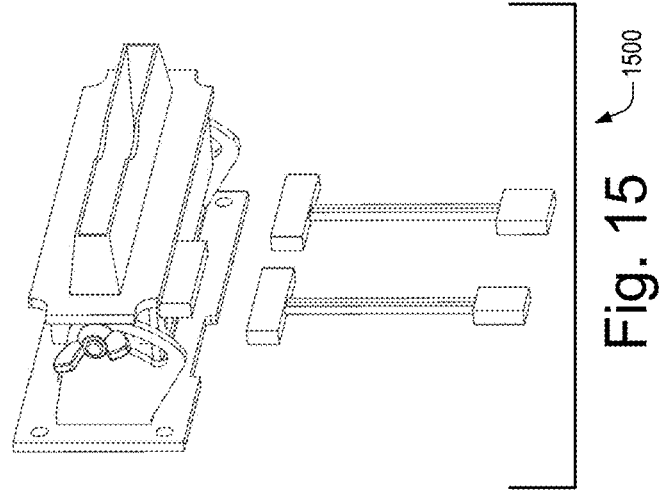

As illustrated in the example embodiment of FIG. 5, the universal adjustable printer bezel assembly 501 includes a multi-interface electrical harness assembly which, in this specific example, comprises a three pin type electrical connector interface 511 and a four pin type electrical connector interface 513. Both interfaces 511 and 513 are electrically connected to a circuit board (e.g., 432, FIG. 4), which may be mounted to the front bezel assembly portion (e.g., via screw bosses 423, FIG. 4). In some embodiments, the electrical harness assemblies 511, 513 may be hardwired (e.g., soldiered) to the circuit board. In other embodiments (e.g., as illustrated in FIGS. 13-15, for example), an electrical connector interface (e.g., 1304, FIG. 14) may be affixed to the circuit board and electrically coupled to other electrical components of the circuit board, and one or more of the electrical harness assemblies may be removably connected to the circuit board via the electrical connector interface.

The multi-interface electrical harness assembly provides the ability for the universal adjustable printer bezel assembly to electrically coupled to any of the ticket printer units 520, 522, 524, 526 (e.g., via their respective 3-pin or 4-pin type electrical interfaces 520a, 522a, 524a, 526a). For example, in the specific example embodiment of FIG. 5, the four pin type electrical connector interface 513 may be used to electrically couple the universal adjustable printer bezel assembly to any of the ticket printer units 520, 522, 524 which provide a four-pin type electrical interface; and the three pin type electrical connector interface 511 may be used to electrically couple the universal adjustable printer bezel assembly to the ticket printer unit 526 which provides a three-pin type electrical interface.

According to different embodiments, the circuit board of universal adjustable printer bezel assembly includes various component(s) and/or circuitry for facilitating and/or controlling electrical connections between components of the universal adjustable printer bezel assembly (such as, for example, LEDs 434, FIG. 4) and a ticket printer device.

Figure 25:
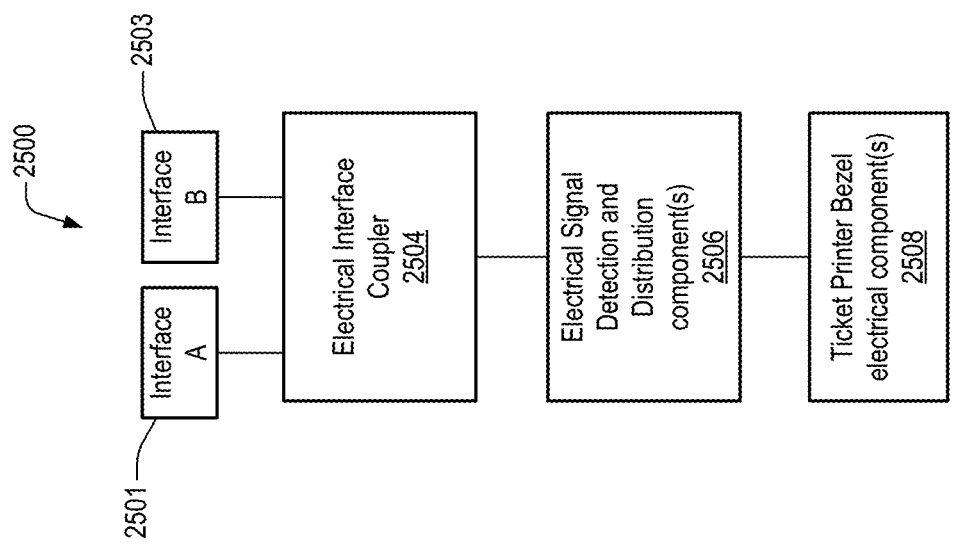

FIG. 25 shows a simplified block diagram of various components which may be included as part of the universal adjustable printer bezel assembly circuit board componentry 2500, in accordance with a specific embodiment. As illustrated in the example embodiment of FIG. 25, the circuit board componentry may include, but is not limited to, one or more of the following (or combinations thereof):

One or more different electrical connector interface(s) (e.g., 2501, 2503), such as, for example, a four pin type electrical connector interface, a three pin type electrical connector interface, and/or other types of electrical connector interfaces.

Electrical Interface Coupler 2504, which may be configured or designed to provide electrical connectivity between the plurality of electrical connector interfaces 2501, 2503 and one or more Electrical Signal Detection and Distribution component(s) 2506.

Electrical Signal Detection and Distribution component(s) 2506. In at least one embodiment, Electrical Signal Detection and Distribution component(s) 2506 may be configured or designed to include functionality for detecting and identifying electrical properties and/or signals (e.g., electrical power, voltage, current, data signals, etc.) at one or more of the electrical connector interfaces, and for distributing power and/or signals to the appropriate electrical components 2508 (e.g., LEDs) of the circuit board.

According to different embodiments, some or all of the circuit board componentry 2500 may be integrated into a programmable microcontroller, circuit, or processor which may be affixed to the circuit board, as illustrated, for example, at 442 (FIG. 4), 1212 (FIG. 12), 1312 (FIG. 13, 14).

In at least one embodiment, when one of the electrical connector interfaces of the universal adjustable printer bezel assembly is connected to the electrical interface of a ticket printer device, the circuit board componentry of the universal adjustable printer bezel assembly may automatically perform one or more actions such as, for example, one or more of the following (or combinations thereof):

detect the electrical connection;
identify the electrical connector interface associated with the electrical connection;
monitor voltage and/or current attributes associated with the electrical connection;
verify voltage and/or current attributes associated with the electrical connection;
perform voltage regulation and/or current regulation, as needed;
facilitate distribution of power (e.g., provided from the ticket printer device) to specific electrical components (e.g., LEDs) of the circuit board and/or other electrical components of the universal adjustable printer bezel assembly);
disable other electrical connector interfaces which are not being used;
and/or other operations or activities.

It is to be appreciated that the multi-interface electrical harness assembly, circuit board componentry, and other electrical connectivity compatibility features of the universal adjustable printer bezel assembly collectively produce a synergistic effect which enables the universal adjustable printer bezel assembly to be compatible with (and to be electrically coupled to) a variety of different ticket printer models from different ticket printer manufacturers.

In addition to these electrical connectivity compatibility features, the universal adjustable printer bezel assembly is also configured or designed to include adjustable bezel angle features which provide the ability for the angle or position of the front bezel assembly portion (e.g., 420, FIG. 4) and/or rear bezel assembly portion (e.g., 410, FIG. 4) to be dynamically adjusted (as desired), for example, to conform with sloped surfaces of exterior portion(s) of gaming cabinets, etc. Illustrative examples of such adjustable bezel angle features are illustrated in FIGS. 6A-10B.

FIGS. 6A-B, 7A-B, 8A-B, 9A-B, and 10A-B depict several different example embodiments illustrating how the adjustable bezel angle features of the universal adjustable printer bezel assembly may be utilized to configure the angle or position of the front bezel assembly portion (e.g., 420, FIG. 4) and/or rear bezel assembly portion (e.g., 410, FIG. 4) to specific angles and/or positions, as desired.

Figure 6A:
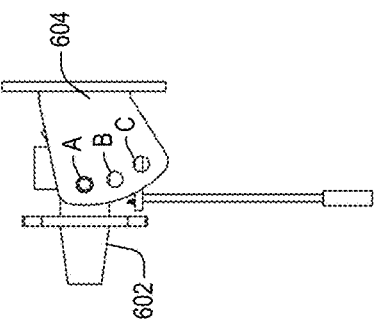
Figure 6B:
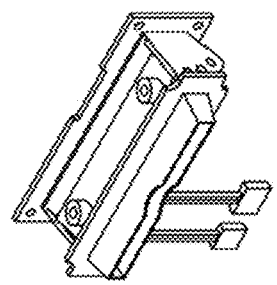

For example, FIGS. 6A-B illustrate an example embodiment where the universal adjustable printer bezel assembly has been configured in a "zero degrees" position. As illustrated in the example embodiment of FIG. 6A, the angular position of universal adjustable printer bezel assembly (e.g., rear bezel assembly portion) may be configured into the "zero degrees" position by causing the pins or detents (e.g., 424, FIG. 4) of the front bezel assembly portion 602 to engage with hole position "A" of the adjustment arms of the rear bezel assembly portion 604.

Figure 7A:
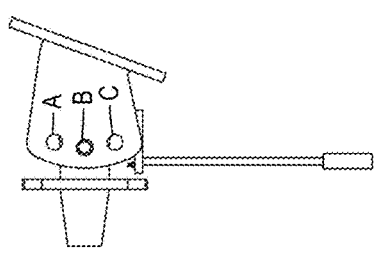
Figure 7B:
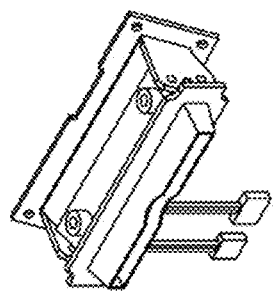

For example, FIGS. 7A-B illustrate an example embodiment where the universal adjustable printer bezel assembly has been configured in a "down 20 degrees" position. As illustrated in the example embodiment of FIG. 7A, the angular position of universal adjustable printer bezel assembly may be configured into the "down 20 degrees" position by causing the pins or detents of the front bezel assembly portion to engage with hole position "B" of the adjustment arms of the rear bezel assembly portion.

Figure 8A:
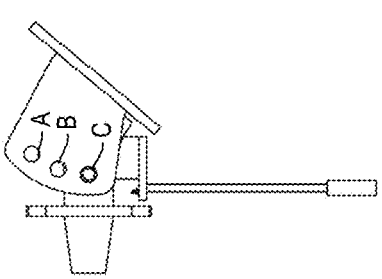
Figure 8B:
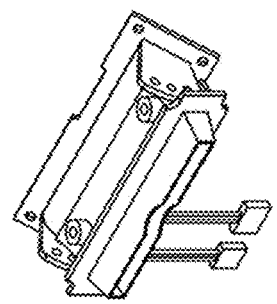

For example, FIGS. 8A-B illustrate an example embodiment where the universal adjustable printer bezel assembly has been configured in a "down 40 degrees" position. As illustrated in the example embodiment of FIG. 8A, the angular position of universal adjustable printer bezel assembly may be configured into the "down 40 degrees" position by causing the pins or detents of the front bezel assembly portion to engage with hole position "C" of the adjustment arms of the rear bezel assembly portion.

Figure 9A:
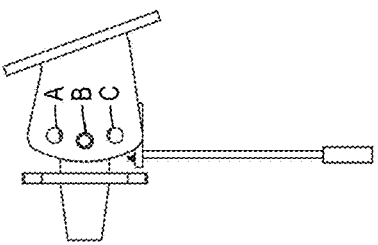
Figure 9B:
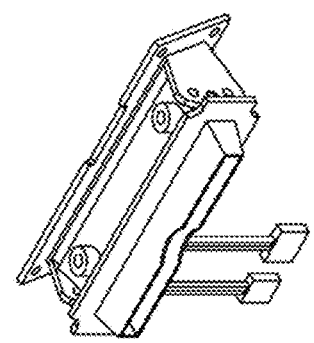

For example, FIGS. 9A-B illustrate an example embodiment where the universal adjustable printer bezel assembly has been configured in a "up 20 degrees" position. As illustrated in the example embodiment of FIG. 9A, the angular position of universal adjustable printer bezel assembly may be configured into the "up 20 degrees" position by inverting the rear bezel assembly portion (e.g., relative to the orientation of the rear bezel assembly portion illustrated in FIG. 7A), and causing the pins or detents of the front bezel assembly portion to engage with hole position "B" of the adjustment arms of the rear bezel assembly portion.

Figure 10A:
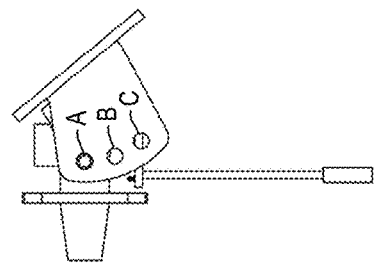
Figure 10B:
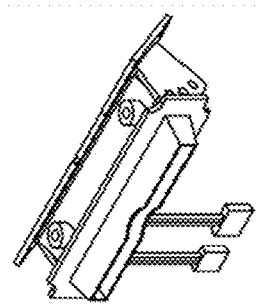

For example, FIGS. 10A-B illustrate an example embodiment where the universal adjustable printer bezel assembly has been configured in a "up 40 degrees" position. As illustrated in the example embodiment of FIG. 10A, the angular position of universal adjustable printer bezel assembly may be configured into the "up 40 degrees" position by inverting the rear bezel assembly portion (e.g., relative to the orientation of the rear bezel assembly portion illustrated in FIG. 7A), and causing the pins or detents of the front bezel assembly portion to engage with hole position "A" of the adjustment arms of the rear bezel assembly portion.

Figure 12:
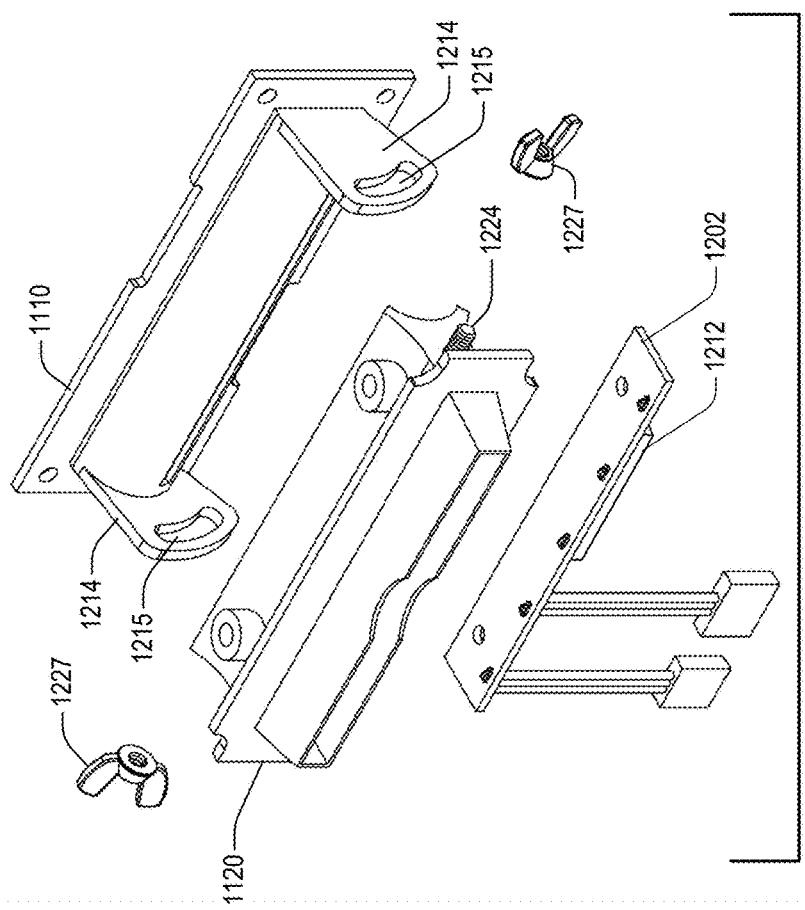
Figure 11:
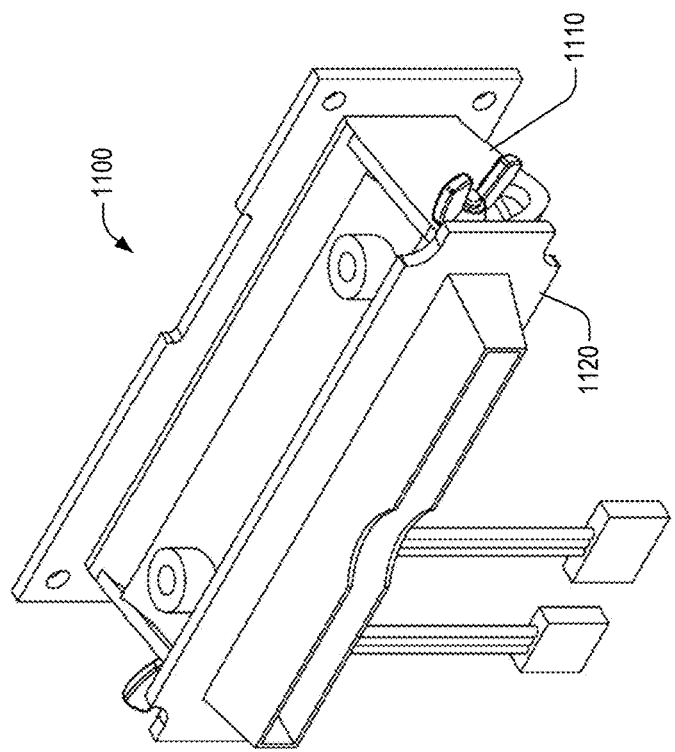

FIGS. 11-12 illustrate an alternate embodiment of a universal adjustable printer bezel assembly 1100. In the specific example embodiment of FIGS. 11-12, the adjustment arms 1214 of the rear bezel assembly portion 1110 include slot portions 1215 (e.g., instead of multiple discrete holes, as illustrated in the universal adjustable printer bezel assembly embodiment 400 of FIG. 4), and the front bezel assembly portion 1120 includes threaded screw portions 1224. The rear bezel assembly portion 1110 may be securely and removably attached to the front bezel assembly portion 1120, for example, by engaging the slot portions 1215 of the adjustment arms with respective screw portions 1224, and securing the regions of engagement with wingnuts 1227 or other suitable types of fasteners. One advantage of the universal adjustable printer bezel assembly embodiment 1100 is that the angle and/or position of the front bezel assembly portion and/or rear bezel assembly portion of the may be adjusted to any desired position or angle (e.g., in contrast to the discrete position(s)/angle(s) of the universal adjustable printer bezel assembly of FIG. 4).

FIGS. 13-15, and 17 illustrate alternate embodiments of universal adjustable printer bezel assemblies having circuit boards that have been adapted to include an electrical connector interface (e.g., 1304, FIG. 13) for enabling different types of electrical harness assemblies to be electrically coupled to the circuit board via connection with the electrical connector interface 1304. For example, referring to FIG. 13, an electrical circuit board assembly is shown which includes circuit board 1302, LEDs 1305, electrical connector interface 1304, circuit board componentry 1312, removable electrical harness assembly A 1306, and removable electrical harness assembly B 1308. In some embodiments, the circuit board componentry 1312 may be integrated into the electrical connector interface 1304.

Each electrical harness assembly 1306, 1308 includes a respective circuit board connector interface (e.g., 1306a, 1308a) which is configured or designed to be removably connected to electrical connector interface 1304. Each electrical harness assembly also includes a respective electrical connector (e.g., 1306b, 1308b) for connecting to various types of electrical interfaces used by different ticket printer devices. For example, in the specific example embodiment of FIG. 13, electrical harness assembly 1306 includes a three pin type electrical connector 1306b which may be used for electrically connecting to ticket printer devices utilizing a three pin type electrical interface. Similarly, electrical harness assembly 1308 includes a four pin type electrical connector 1308b which may be used for electrically connecting to ticket printer devices utilizing a four pin type electrical interface.

FIG. 14 shows an alternate embodiment of a universal adjustable printer bezel assembly 1400 which includes front and rear bezel assembly portions similar to those of universal adjustable printer bezel assembly 400 (FIG. 4), and which includes an electrical assembly similar to the electrical assembly 1300 of FIG. 13.

FIG. 15 shows an alternate embodiment of a universal adjustable printer bezel assembly 1500 which includes front and rear bezel assembly portions similar to those of universal adjustable printer bezel assembly 11 (FIG. 12), and which includes an electrical assembly similar to the electrical assembly 1300 of FIG. 13.

Figure 16:
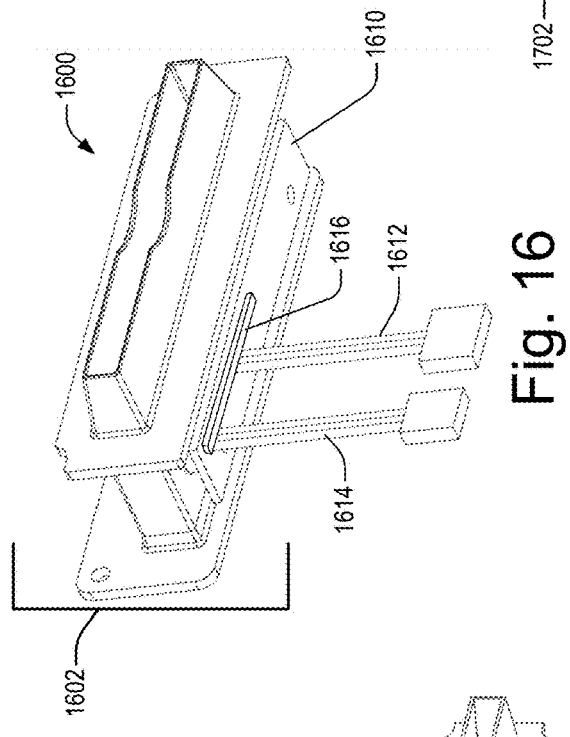

FIG. 16 shows an alternate embodiment of a ticket printer bezel assembly 1600. As illustrated in the specific example embodiment of FIG. 16, the ticket printer bezel assembly 1600 is comprised of a unitary, single-piece ticket printer bezel portion 1602 and an electrical assembly portion similar to the electrical assembly portion 430 of FIG. 4.

Figure 17:
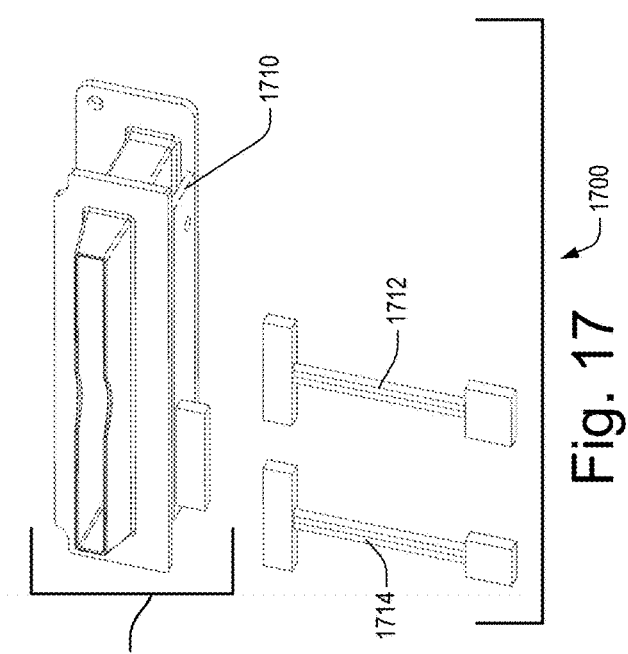

FIG. 17 shows an embodiment of a ticket printer bezel assembly 1700 which includes an electrical assembly similar to the electrical circuit board assembly 1300 of FIG. 13. Similar to the ticket printer bezel assembly of FIG. 16, the ticket printer bezel assembly 1700 is comprised of a unitary, single-piece ticket printer bezel portion 1702 and an electrical assembly similar to the electrical assembly 1300 of FIG. 13.

It is noted that one of the advantages of the ticket printer bezel assemblies 1600, 1700 over that of conventional ticket printer bezels relates to the abilities of the ticket printer bezel assemblies 1600, 1700 to be compatible with, and to be electrically coupled to, different types of electrical interfaces associated with ticket printer models from different ticket printer manufacturers. Conventional ticket printer bezels do not include such functionality.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. A bezel assembly for dispensing a flexible substrate, the bezel assembly comprising:
   a rear bezel body including a first slot disposed in the rear bezel body, the first slot having a first front opening for outputting the flexible substrate and having a first rear opening for receiving the flexible substrate, the first slot being configured or designed to facilitate transport of the flexible substrate through the first slot, the rear bezel body further including a first attachment interface;
   a front bezel body including a second slot disposed in the front bezel body, the second slot having a second front opening for outputting the flexible substrate and having a second rear opening for receiving the flexible substrate from the first front opening of the rear bezel body, the second slot being configured or designed to facilitate transport of the flexible substrate through the second slot, the front bezel body further including a second attachment interface;
   wherein the front bezel body is removably and directly connectable to the rear bezel body via engagement of the first and second attachment interfaces;
   wherein the first and second attachment interfaces are configured or designed to engage with each other in accordance with a plurality of different engagement configurations, including a first engagement configuration, and a second engagement configuration;
   wherein, when the first and second attachment interfaces are mutually engaged in accordance with the first engagement configuration, the front bezel body and rear bezel body are coupled together in accordance with a first coupled configuration corresponding to a first angle of coupling between the front bezel body and rear bezel body;
   wherein, when the first and second attachment interfaces are mutually engaged in accordance with the second engagement configuration, the front bezel body and rear bezel body are coupled together in accordance with a second coupled configuration corresponding to a second angle of coupling between the front bezel body and rear bezel body; and
   wherein the first angle of coupling is different from the second angle of coupling.

2. The bezel assembly of claim 1, wherein the flexible substrate corresponds to a ticket-in/ticket-out ("TITO") type ticket or voucher.

3. The bezel assembly of claim 1, wherein the first and second attachment interfaces are configured or designed to provide a plurality of different engagement configurations for enabling the front bezel body and rear bezel body to be coupled together in accordance with a plurality of different positional configurations.

4. The bezel assembly of claim 1, wherein the first and second attachment interfaces are configured or designed to enable the front bezel body and rear bezel body to be adjustably coupled together in a manner which enables the front bezel body and/or rear bezel body to be adjusted into a plurality of different positions.

5. The bezel assembly of claim 1 wherein the front bezel body and rear bezel body are configured or designed in a manner such that, when the front bezel body is coupled to the rear bezel body, the first slot and second slot are caused to be in alignment with each other so as to help facilitate transport of the flexible substrate through the first and second slots.

6. The bezel assembly of claim 1:
wherein the rear bezel body further includes a mounting plate portion;
wherein the mounting plate portion defines a mounting surface configured or designed to enable the rear bezel body to be mounted to a ticket printer device; and
wherein the mounting surface includes the first rear opening for receiving the flexible substrate from the ticket printer device.

7. The bezel assembly of claim 1:
wherein the first slot is tapered such that a height of the first rear opening is greater than a height of the first front opening; and
wherein the second slot is tapered such that a height of the second rear opening is greater than a height of the second front opening.

8. The bezel assembly of claim 1:
wherein the rear bezel body includes a first projection extending from the rear bezel body, the first projection including a distal end portion which includes the first attachment interface.

9. The bezel assembly of claim 1:
wherein the rear bezel body includes a first projection extending from the rear bezel body, the first projection including a first distal end portion which includes a first part of the first attachment interface;
wherein the rear bezel body further includes a second projection extending from the rear bezel body, the second projection including a second distal end portion which includes a second part of the first attachment interface;
wherein the front bezel body includes a first part of the second interface disposed at a first side of the front bezel body; and
wherein the front bezel body includes a second part of the second interface disposed at a second side of the front bezel body.

10. The bezel assembly of claim 1 further comprising an electrical system configured or designed to enable the bezel assembly to be electrically coupled to a plurality of electrical connection interface types, including a first electrical connection interface type and a second electrical connection interface type which is different from the first electrical connection interface type.

11. The bezel assembly of claim 1 further comprising an electrical system configured or designed to enable the bezel assembly to be electrically coupled to a plurality of electrical connector interface types, including a three-pin type electrical connector interface type and a four-pin electrical connector interface type.

12. The bezel assembly of claim 1 further comprising a plurality of electrical components, including:
a circuit board;
a first electrical harness electrically connected to the circuit board, the first electrical harness being configured or designed to enable the circuit board to be electrically coupled to a first type of electrical connector interface; and
a second electrical harness electrically connected to the circuit board, the second electrical harness being configured or designed to enable the circuit board to be electrically coupled to a second type of electrical connector interface different from the first type of electrical connector interface.

13. The bezel assembly of claim 1 further comprising a plurality of electrical components, including:
a circuit board;
at least one electrical interface electrically coupled to the circuit board;
a first electrical harness configured or designed to be removably connected to the circuit board via the at least one electrical interface, the first electrical harness including a first type of electrical connector configured or designed to electrically couple to at least one external device having a first type of electrical connector interface; and
a second electrical harness configured or designed to be removably connected to the circuit board via the at least one electrical interface, the second electrical harness including a second type of electrical connector configured or designed to electrically couple to at least one external device having a second type of electrical connector interface; and
wherein the first type of electrical connector interface is different from the second type of electrical connector interface.

14. The bezel assembly of claim 1 wherein the front bezel body and rear bezel body are each separate parts of the bezel assembly.

15. A bezel assembly for dispensing a flexible substrate, the bezel assembly comprising:
a rear bezel body including a first slot disposed in the rear bezel body, the first slot having a first front opening for outputting the flexible substrate and having a first rear opening for receiving the flexible substrate, the first slot being configured or designed to facilitate transport of the flexible substrate through the first slot, the rear bezel body further including a first attachment means;
a front bezel body including a second slot disposed in the front bezel body, the second slot having a second front opening for outputting the flexible substrate and having a second rear opening for receiving the flexible substrate from the first front opening of the rear bezel body, the second slot being configured or designed to facilitate transport of the flexible substrate through the second slot, the front bezel body further including a second attachment means;
wherein the front bezel body is removably and directly connectable to the rear bezel body via engagement of the first and second attachment means;
wherein the first and second attachment means are configured or designed to engage with each other in accordance with a plurality of different engagement configurations, including a first engagement configuration, and a second engagement configuration;
wherein, when the first and second attachment means are mutually engaged in accordance with the first engagement configuration, the front bezel body and rear bezel body are coupled together in accordance with a first coupled configuration corresponding to a first angle of coupling between the front bezel body and rear bezel body;

wherein, when the first and second attachment means are mutually engaged in accordance with the second engagement configuration, the front bezel body and rear bezel body are coupled together in accordance with a second coupled configuration corresponding to a second angle of coupling between the front bezel body and rear bezel body; and wherein the first angle of coupling is different from the second angle of coupling.

* * * * *